United States Patent
Calderoni et al.

(10) Patent No.: US 11,711,924 B2
(45) Date of Patent: **\*Jul. 25, 2023**

(54) METHODS OF FORMING STRUCTURES CONTAINING LEAKER-DEVICES AND MEMORY CONFIGURATIONS INCORPORATING LEAKER-DEVICES

(71) Applicant: Micron Technology, Inc., Boise, ID (US)

(72) Inventors: Alessandro Calderoni, Boise, ID (US); Beth R. Cook, Boise, ID (US); Durai Vishak Nirmal Ramaswamy, Boise, ID (US); Ashonita A. Chavan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/693,035

(22) Filed: Mar. 11, 2022

(65) Prior Publication Data

US 2022/0199634 A1 Jun. 23, 2022

Related U.S. Application Data

(60) Continuation of application No. 17/131,065, filed on Dec. 22, 2020, now Pat. No. 11,315,939, which is a (Continued)

(51) Int. Cl.
*H10B 53/40* (2023.01)
*H01G 4/008* (2006.01)
(Continued)

(52) U.S. Cl.
CPC ........... *H10B 53/40* (2023.02); *G11C 11/221* (2013.01); *G11C 11/2295* (2013.01);
(Continued)

(58) Field of Classification Search
None
See application file for complete search history.

(56) References Cited

U.S. PATENT DOCUMENTS 6,165,834 A * 12/2000 Agarwal ........... H01L 21/02337
257/295
6,617,206 B1 * 9/2003 Sandhu ................ H10B 12/312
438/770

(Continued)

FOREIGN PATENT DOCUMENTS

| | | |
|---|---|---|
| EP | 20745060 | 3/2022 |
| WO | WO PCT/US2020/014281 | 5/2020 |
| WO | WO PCT/US2020/014281 | 7/2021 |

OTHER PUBLICATIONS

Wang et al., "Leakage Current and Dielectric Properties of Integrated Ferroelectric Capacitor Etched in Non-Crystalline Phase", Integrated Ferroelectrics vol. 132, 2012, United Kingdom, pp. 107-113.

*Primary Examiner* — Khaja Ahmad
(74) *Attorney, Agent, or Firm* — Wells St. John P.S.

(57) ABSTRACT

Some embodiments include an integrated assembly having first electrodes with top surfaces, and with sidewall surfaces extending downwardly from the top surfaces. The first electrodes are solid pillars. Insulative material is along the sidewall surfaces of the first electrodes. Second electrodes extend along the sidewall surfaces of the first electrodes and are spaced from the sidewall surfaces by the insulative material. Conductive-plate-material extends across the first and second electrodes, and couples the second electrodes to one another. Leaker-devices electrically couple the first electrodes to the conductive-plate-material and are configured to discharge at least a portion of excess charge from the (Continued)

first electrodes to the conductive-plate-material. Some embodiments include methods of forming integrated assemblies.

20 Claims, 20 Drawing Sheets

Related U.S. Application Data continuation of application No. 16/909,770, filed on Jun. 23, 2020, now Pat. No. 10,903,218, which is a division of application No. 16/255,569, filed on Jan. 23, 2019, now Pat. No. 10,833,092.

(51) Int. Cl.
    *H01G 4/06*         (2006.01)
    *H01G 4/40*         (2006.01)
    *G11C 11/22*       (2006.01)
    *H10B 53/10*       (2023.01)
    *H10B 53/30*       (2023.01)
    *H01L 49/02*       (2006.01)

(52) U.S. Cl.
    CPC ............... *H01G 4/008* (2013.01); *H01G 4/06* (2013.01); *H01G 4/40* (2013.01); *H01L 28/55* (2013.01); *H01L 28/60* (2013.01); *H10B 53/10* (2023.02); *H10B 53/30* (2023.02)

(56) References Cited

U.S. PATENT DOCUMENTS

| | | |
|---|---|---|
| 9,305,929 B1 | 4/2016 | Karda et al. |
| 9,842,839 B1 | 12/2017 | Sills et al. |
| 10,650,978 B2 | 5/2020 | Chavan et al. |
| 2004/0217410 A1* | 11/2004 | Meng .................... H01L 29/511 |
| | | 257/E21.171 |
| 2006/0086961 A1 | 4/2006 | Iijima et al. |
| 2007/0114588 A1* | 5/2007 | Shibata ................ H10B 12/033 |
| | | 257/296 |
| 2015/0279845 A1 | 10/2015 | Kishida |
| 2015/0311217 A1* | 10/2015 | Chavan ................... H01L 28/90 |
| | | 257/295 |
| 2016/0155936 A1 | 6/2016 | Tang et al. |
| 2017/0117036 A1 | 4/2017 | Al-Shamma et al. |
| 2017/0154952 A1* | 6/2017 | Komeda ............... H01L 27/016 |
| 2018/0122816 A1* | 5/2018 | Ramaswamy ........ G11C 11/221 |
| 2018/0195049 A1 | 7/2018 | Ramaswamy |
| 2018/0197870 A1 | 7/2018 | Balakrishnan et al. |

\* cited by examiner

_US 11,711,924 B2_

METHODS OF FORMING STRUCTURES CONTAINING LEAKER-DEVICES AND MEMORY CONFIGURATIONS INCORPORATING LEAKER-DEVICES

RELATED PATENT DATA

This patent resulted from a continuation of U.S. patent application Ser. No. 17/131,065 filed Dec. 22, 2020, which is a continuation of U.S. patent application Ser. No. 16/909,770 filed Jun. 23, 2020, now U.S. Pat. No. 10,903,218, which is a divisional of U.S. patent application Ser. No. 16/255,569 filed Jan. 23, 2019, now U.S. Pat. No. 10,833,092, each of which is hereby incorporated by reference herein.

TECHNICAL FIELD

Methods of incorporating leaker-devices into capacitor configurations to reduce cell disturb, and capacitor configurations incorporating leaker-devices.

BACKGROUND

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Charge buildup within memory cells can be problematic for at least the reasons that such may make it difficult to reliability store data. Charge buildup may be become increasingly difficult to control as circuitry is scaled to increasingly smaller dimensions.

It would be desirable to develop architectures which alleviate, or even prevent, undesired charge buildup; and to develop methods for fabricating such architectures.

DETAILED DESCRIPTION OF THE ILLUSTRATED EMBODIMENTS

Some embodiments include utilization of leaker-devices to reduce charge buildup along bottom electrodes of capacitors. The leaker-devices may couple the bottom electrodes to a conductive plate. The conductive plate may be along top electrodes of the capacitors, and may be utilized to electrically couple the top electrodes to one another. The leaker-devices may have conductivity (or alternatively, resistance) tailored to enable excess charge to drain from the bottom electrodes to the conductive plate, while not enabling problematic shorting between the bottom electrodes and the conductive plate.

Many, if not most, primary memory cell disturb mechanisms are due to a buildup of potential at cell bottom (CB) electrode nodes. As discussed in more detail below, this disturb mechanism is applicable for ferroelectric RAM (FERAM). However, other types of electronic devices may benefit from the disclosed subject matter as well.

In an embodiment, each of the memory cells in a memory array can be programmed to one of two data states to represent a binary value of "0" or "1" in a single bit. Such a cell is sometimes called a single-level cell (SLC). Various operations on these types of cells are independently known in the semiconductor and related arts.

Regardless of the memory cell arrangement, the primary disturb mechanisms discussed above can arise due to different factors. For example, charge on the cell bottom-node can rise due to factors such as plate glitch, access transistor leakage, cell-to-cell interactions, and/or other factors. If a dielectric material in a memory cell leaks significantly, the state of the cell may be adversely affected.

In various embodiments described herein, leaker-devices are introduced into a memory array to prevent build-up of potential at bottom nodes of capacitors associated with individual memory cells. Example embodiments are described with reference to FIGS. 1-21.

Figure 1:
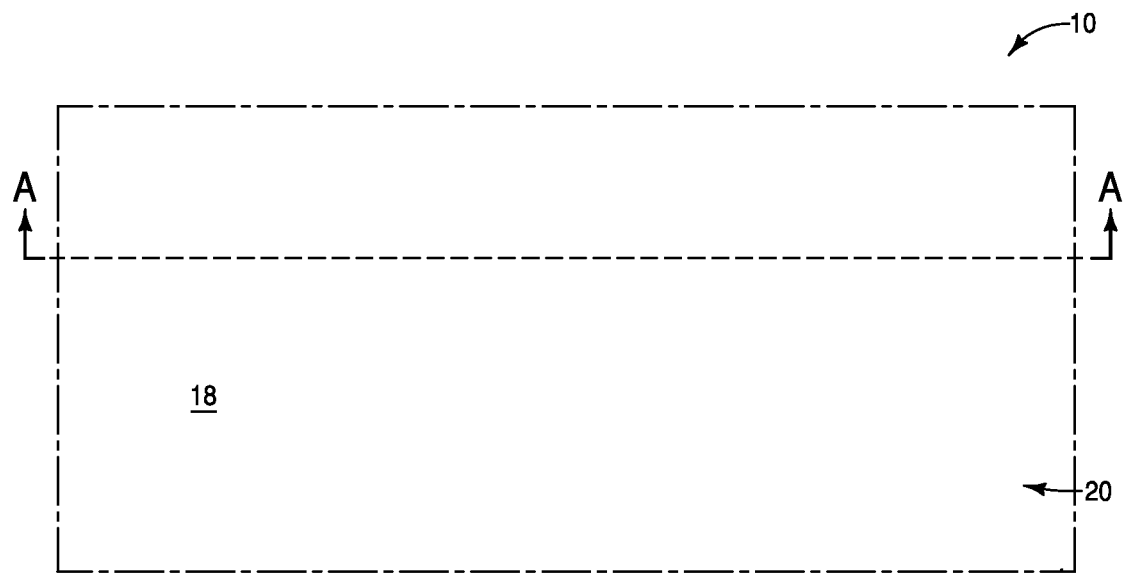
FIG. 1 is a diagrammatic top view of a region of an example assembly at an example process stage of an example method for forming an example integrated structures.
Figure 1A:
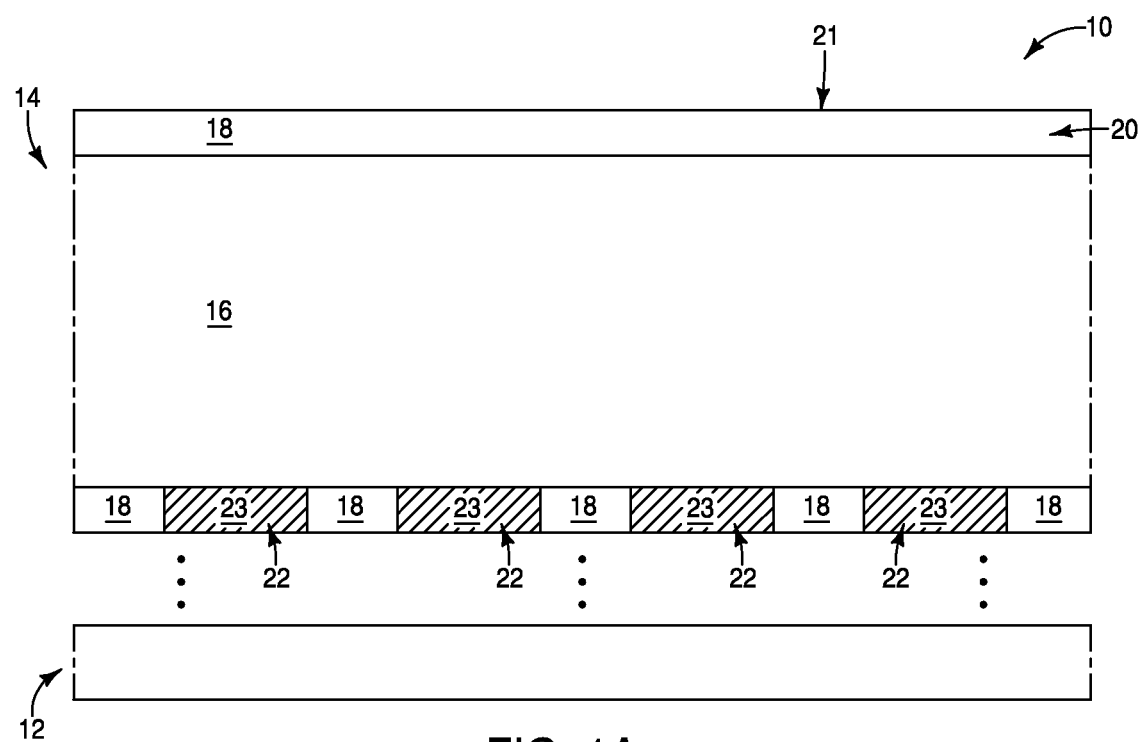
FIG. 1A is a diagrammatic cross-sectional side view of the example assembly of FIG. 1. The view of FIG. 1A is along the line A-A of FIG. 1.

Referring to FIGS. 1 and 1A, an assembly (i.e. apparatus, construction, etc.) 10 comprises a structure 14 over a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the structure 14 to indicate that there may be additional materials, components, etc., provided between the base 12 and the structure 14.

The structure 14 is shown to comprise first and second materials 16 and 18. The first material 16 may be a sacrificial material; and in some embodiments may comprise, consist essentially of, or consist of silicon (e.g., polycrystalline silicon or polysilicon).

The second material 18 may be considered to form an insulative lattice, and may be referred to as an insulative-lattice-material. In some embodiments, the second material 18 may comprise, consist essentially of, or consist of silicon nitride.

In the shown embodiment, the insulative-lattice-material 18 includes a horizontal beam 20 over the sacrificial material 16. The horizontal beam 20 has an upper surface (i.e., top surface) 21.

The horizontal beam 20 will provide support to conductive pillars (discussed below) which are formed through the structure 14. In some embodiments (not shown) additional beams of the lattice material 18 may pass through the sacrificial 16 to provide additional support to the conductive pillars. In some embodiments, the structure 14 may be referred to as a supporting structure, in that such structure will provide support to the conductive pillars formed therein.

In some embodiments, the first material 16 may be selectively etchable relative to the second material 18. The term "selectively etchable" means that the first material may be removed faster than the second material with appropriate etching conditions; and may include, but is not limited to, applications in which the conditions are 100% selective for removal of the first material relative to the second material.

Although the materials 16 and 18 are shown to be homogeneous in the illustrated embodiment, in other embodiments one or both of the materials 16 and 18 may be a heterogeneous combination of two or more compositions.

The material 18 is shown provided in segments under the sacrificial material 16, as well as being in the beam 20 above the sacrificial material 16. In other embodiments, an insulative material different from the material 18 may be provided below the sacrificial material 16 in place of the illustrated segments of material 18.

Conductive structures (i.e., conductive contacts) 22 are shown within a bottom region of the structure 14. Processing described herein forms capacitors (e.g., capacitors shown in FIG. 12), and the conductive structures 22 may be utilized to couple electrodes of such capacitors with additional circuitry (e.g., transistors).

The conductive structures 22 comprise conductive material 23. Such conductive material may comprise any suitable composition or combination of compositions; such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 23 may comprise tungsten.

Figure 2:
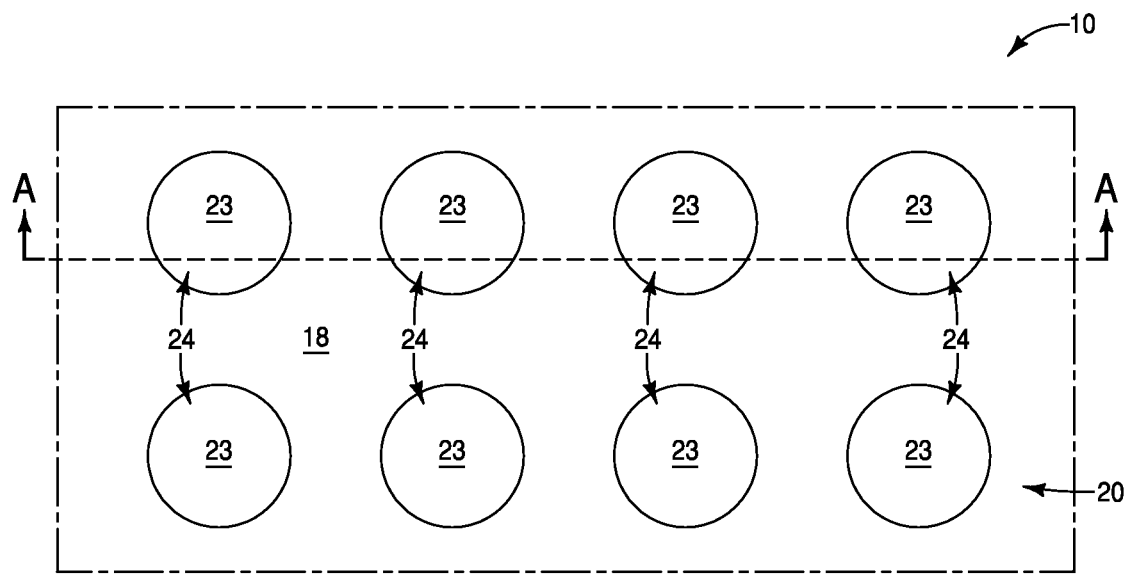
FIG. 2 is a diagrammatic top view of a region of the example assembly of FIG. 1 at an example process stage following that of FIG. 1.
Figure 2A:
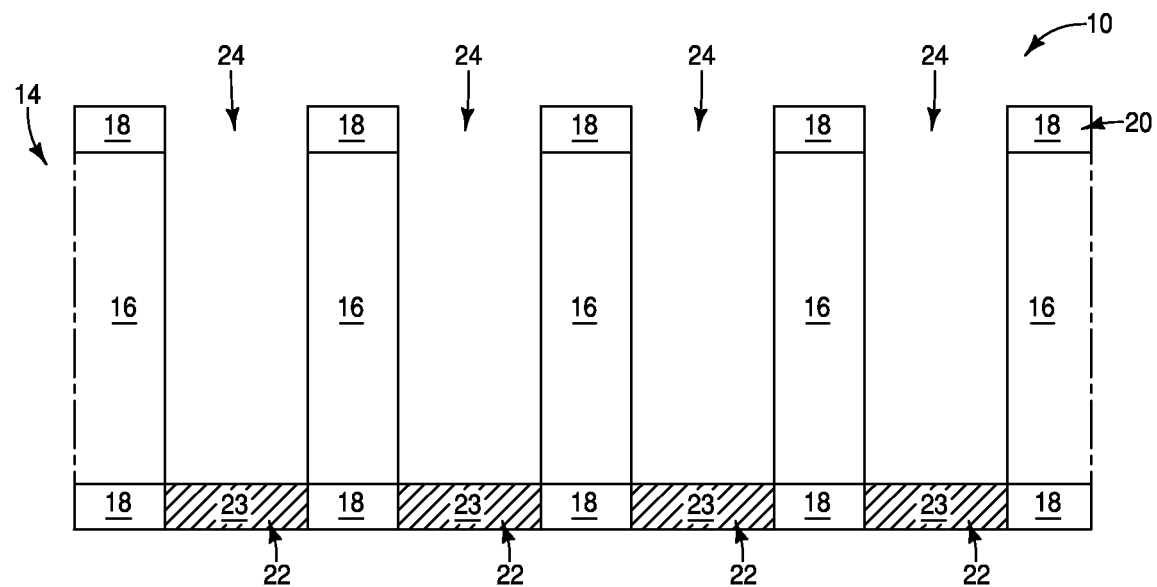
FIG. 2A is a diagrammatic cross-sectional side view of the example assembly of FIG. 2. The view of FIG. 2A is along the line A-A of FIG. 2.

Referring to FIGS. 2 and 2A, openings 24 are formed in the supporting structure 14. The openings 24 extend through materials 16 and 18, and expose upper surfaces of the conductive structures 22. The openings 24 may be formed with any suitable processing. For instance, a patterned mask (not shown) may be provided over supporting structure 14 and utilized to define locations of openings 24, and then the openings 24 may be extended into the supporting structure 14 with one or more suitable etches. Subsequently, the patterned mask may be removed to leave the assembly of FIGS. 2 and 2A.

It is noted that the base 12 (FIG. 1A) is not shown in FIG. 2A, or in any of the other figures which follow, in order to reduce the overall sizes of the drawings. It is to be understood, however, that the base would be present at the process stages of such figures.

The openings 22 may have any suitable shape. FIG. 2 shows an example application in which the openings are circular-shaped when viewed from above. In other embodiments, the openings 22 may have other shapes, including, for example, elliptical shapes, polygonal shapes, etc.

Figure 3:
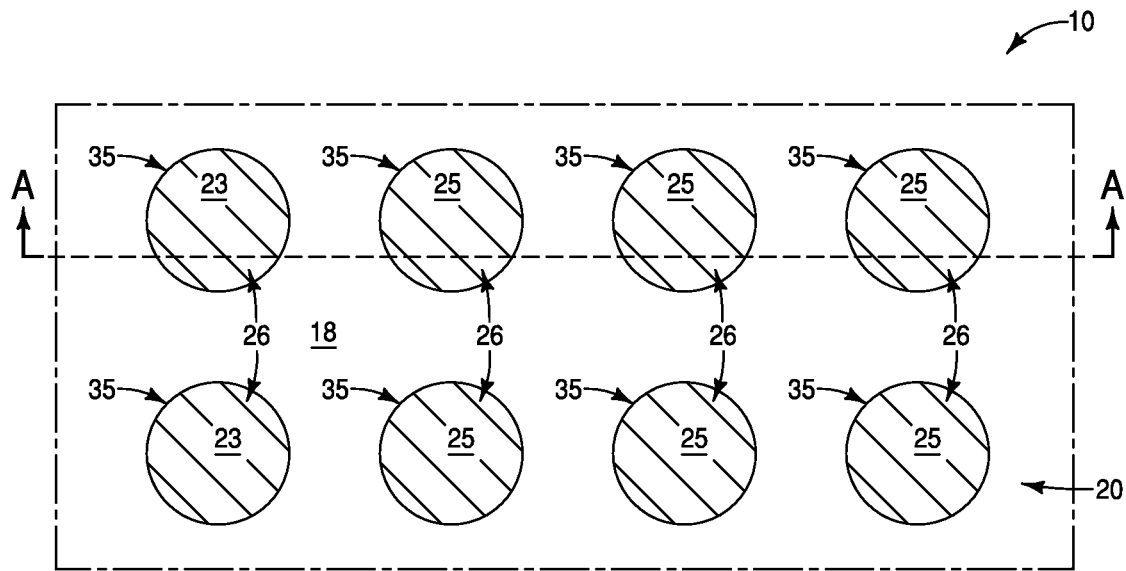
FIG. 3 is a diagrammatic top view of a region of the example assembly of FIG. 1 at an example process stage following that of FIG. 2.
Figure 3A:
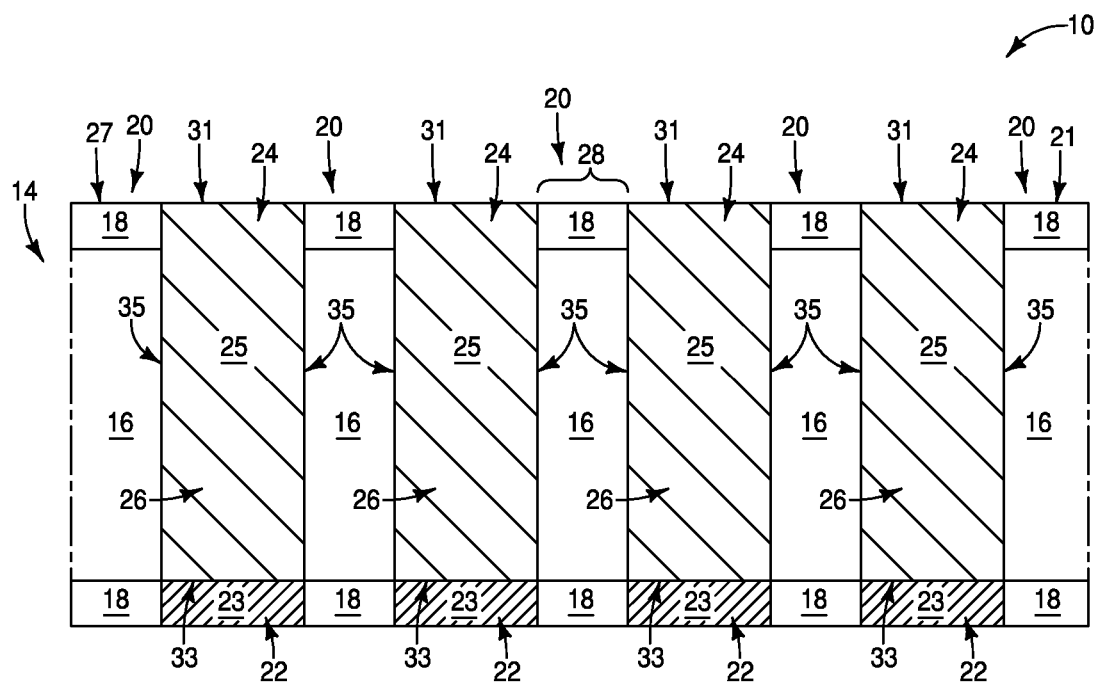
FIG. 3A is a diagrammatic cross-sectional side view of the example assembly of FIG. 3. The view of FIG. 3A is along the line A-A of FIG. 3.

Referring to FIGS. 3 and 3A, conductive material 25 is formed within the openings 24. The conductive material 25 is ultimately utilized to form electrodes of capacitors; and may be referred to as electrode material or as first-electrode-material. The electrode material 25 may comprise any suitable composition or combination of combinations; such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode material 25 may comprise, consist essentially of, or consist of titanium nitride.

The conductive material 25 is patterned into pillars 26 (which may be referred to herein as conductive pillars, as vertically-extending pillars, as first electrodes, as first-capacitor-electrodes, or as first-electrode-pillars). The conductive pillars 26 extend vertically through the supporting structure 14 to the conductive contacts 22. Each of the pillars 26 comprises a top surface 31 and a bottom surface 33. Each of the pillars also comprises a sidewall surface 35 extending from the top surface 31 to the bottom surface 33. Each of the pillars 33 comprises a pair of opposing sidewall surfaces 35 along the cross-section of FIG. 3A; but the top view of FIG. 3 shows that such opposing sidewall surfaces actually merge into a single sidewall surface of each of the pillars. In the shown embodiment, the pillars 26 are solid (specifically, are not hollow or container-shaped).

The bottom surfaces 33 of the pillars 26 are directly against the conductive material 23 of the contacts 22 in the shown embodiment.

The conductive material 25 may be formed within the opening 24 utilizing any suitable processing; including, for example, one or more of physical vapor deposition (PVD), atomic layer deposition (ALD) and chemical vapor deposition (CVD). In some embodiments, the conductive material 25 may be formed to overfill the openings 24, and subsequently planarization (e.g., chemical-mechanical polishing (CMP)) may be utilized to remove excess material 25 and to form the planarized upper surface 27 which extends across the top surface 21 of the insulative-lattice-material 18, and across the top surfaces 31 of the pillars 26.

The vertically-extending pillars 26 of FIG. 3A are horizontally spaced from one another along the illustrated cross-section; and specifically are spaced from one another by intervening spaces 28 (only one of which is labeled in FIG. 3A). The vertically-extending pillars 26 of FIG. 3A may be considered to be laterally supported by the horizontal beam 20 of the lattice structure comprising the lattice material 18. The horizontal beam extends between the sidewall surfaces 35 of neighboring pillars.

Figure 4:
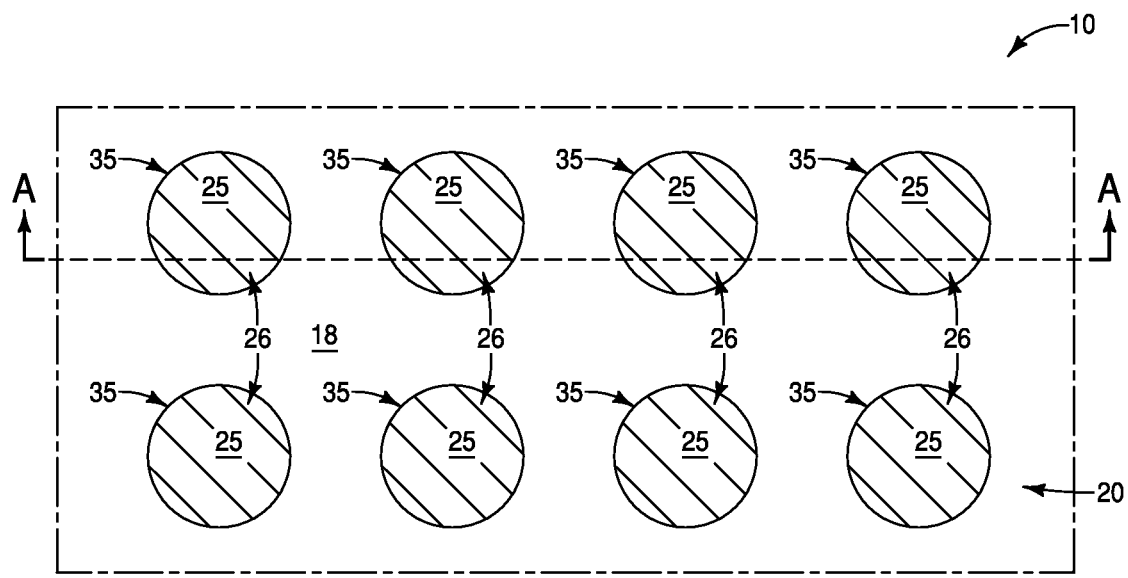
FIG. 4 is a diagrammatic top view of a region of the example assembly of FIG. 1 at an example process stage following that of FIG. 3.
Figure 4A:
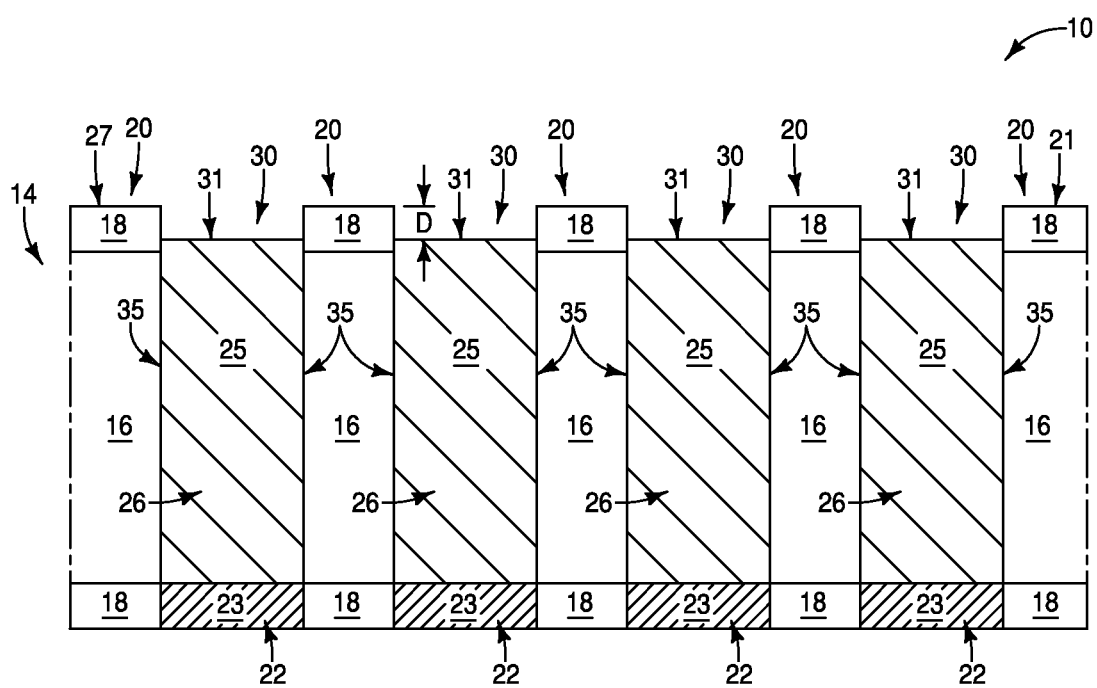
FIG. 4A is a diagrammatic cross-sectional side view of the example assembly of FIG. 4. The view of FIG. 4A is along the line A-A of FIG. 4.

Referring to FIGS. 4 and 4A, the top surfaces 31 of the conductive pillars 26 are recessed relative to the top surface 21 of the insulative-lattice-material 18. Such forms recesses 30 over the conductive pillars 26. The top surfaces 31 are recessed to a depth D such that the top surfaces are still along the insulative-lattice-material 18 (i.e., the sacrificial material 16 is not exposed). In some embodiments, the depth D may be within a range of from at least about 10% of the thickness of the insulative-lattice-material 18 to at least about 90% of the thickness of the insulative-lattice-material 18. In some embodiments, the depth D may be at least about 50 angstroms (Å). In some embodiments, the material 18 may have a thickness within a range of from about 100 Å to about 500 Å, and the depth D may be within a range of from about 50 Å to about 490 Å.

The top surfaces 31 of the pillars 26 may be recessed with any suitable processing, including, for example, utilization of an etch selective for the conductive material 25 relative to the insulative material 18. The etch may be timed so that the recesses 30 are formed to the desired depth.

Figure 5:
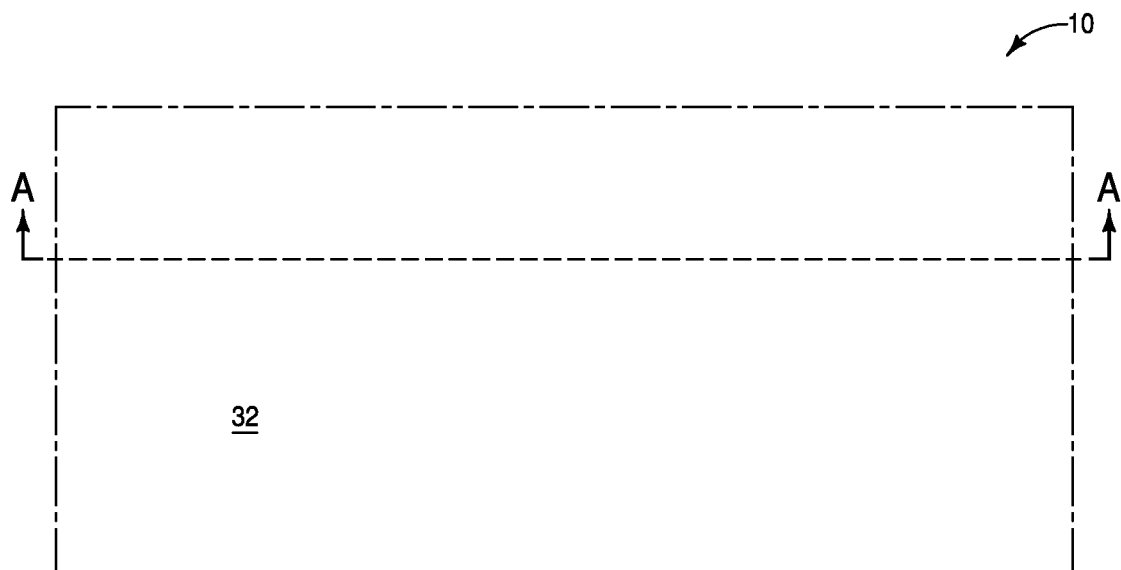
FIG. 5 is a diagrammatic top view of a region of the example assembly of FIG. 1 at an example process stage following that of FIG. 4.
Figure 5A:
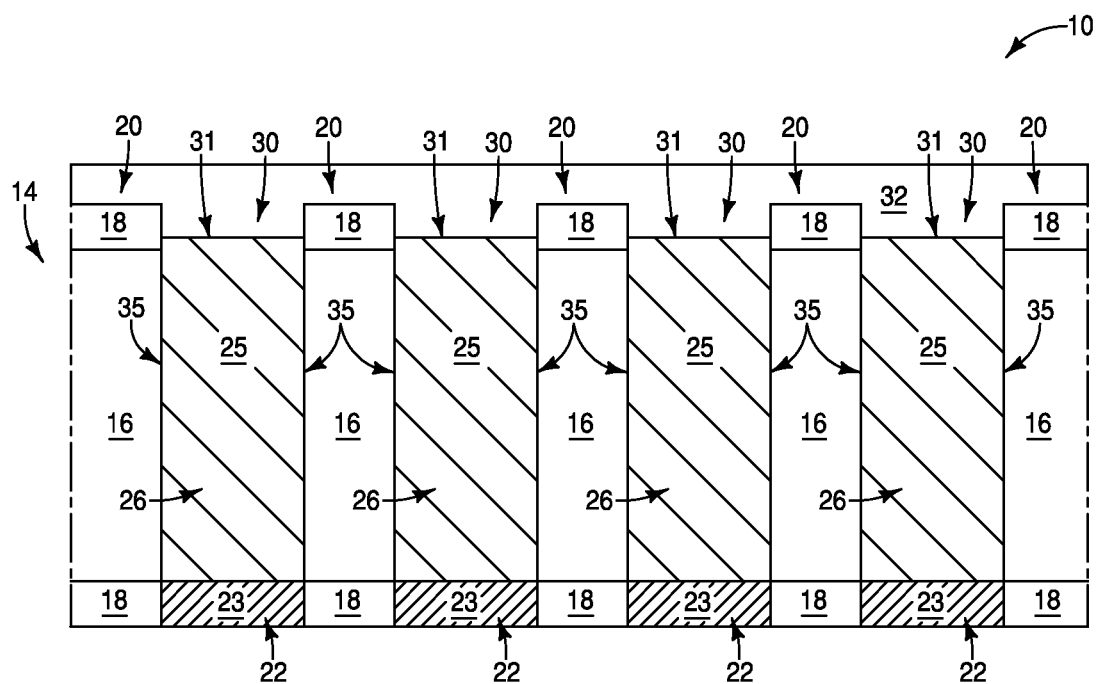
FIG. 5A is a diagrammatic cross-sectional side view of the example assembly of FIG. 5. The view of FIG. 5A is along the line A-A of FIG. 5.

Referring to FIGS. 5 and 5A, leaker-device-material 32 is formed within the recesses 30 and over the upper surface 21 of the insulative-lattice-material 18. The leaker-device-material may comprise any suitable composition or combination of compositions. In some embodiments, the leaker-device-material 32 may comprise, consist essentially of, or consist of one or more of titanium, nickel and niobium in combination with one or more of germanium, silicon, oxygen, nitrogen and carbon. In some embodiments, the leaker-device-material may comprise, consist essentially of, or consist of one or more of Si, Ge, SiN, TiSiN, TiO, TiN, NiO, NiON and TiON; where the chemical formulas indicate primary constituents rather than particular stoichiometries. In some embodiments, the leaker device material may comprise, consist essentially of, or consist of titanium, oxygen and nitrogen. In some embodiments, the leaker-device-material may comprise amorphous silicon, niobium oxide, silicon-rich silicon nitride, etc.; either alone or in any suitable combination.

Figure 6:
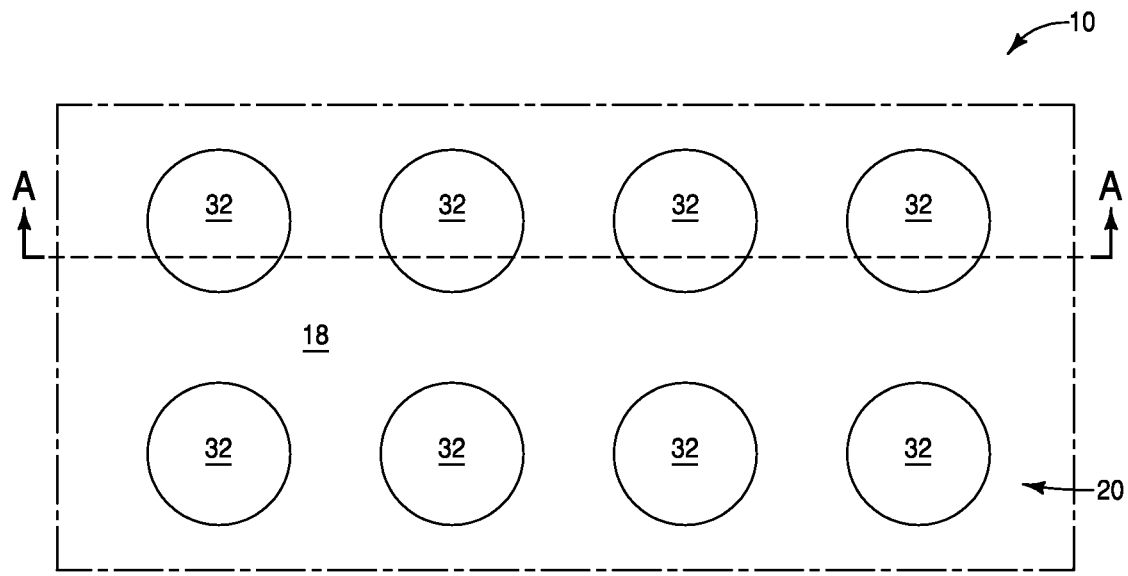
FIG. 6 is a diagrammatic top view of a region of the example assembly of FIG. 1 at an example process stage following that of FIG. 5.
Figure 6A:
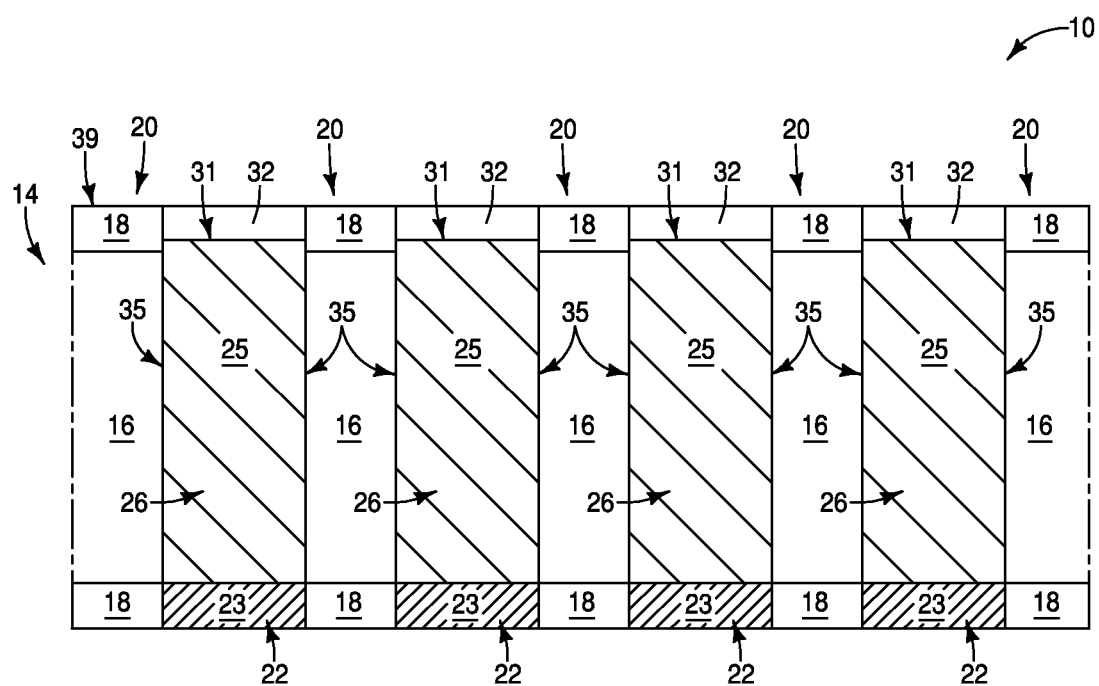
FIG. 6A is a diagrammatic cross-sectional side view of the example assembly of FIG. 6. The view of FIG. 6A is along the line A-A of FIG. 6.

Referring to FIGS. 6 and 6A, the assembly 10 is subjected to planarization (e.g., CMP) to form a planarized upper surface 39 extending across the insulative-lattice-material 18 and the leaker-device-material 32.

Figure 7:
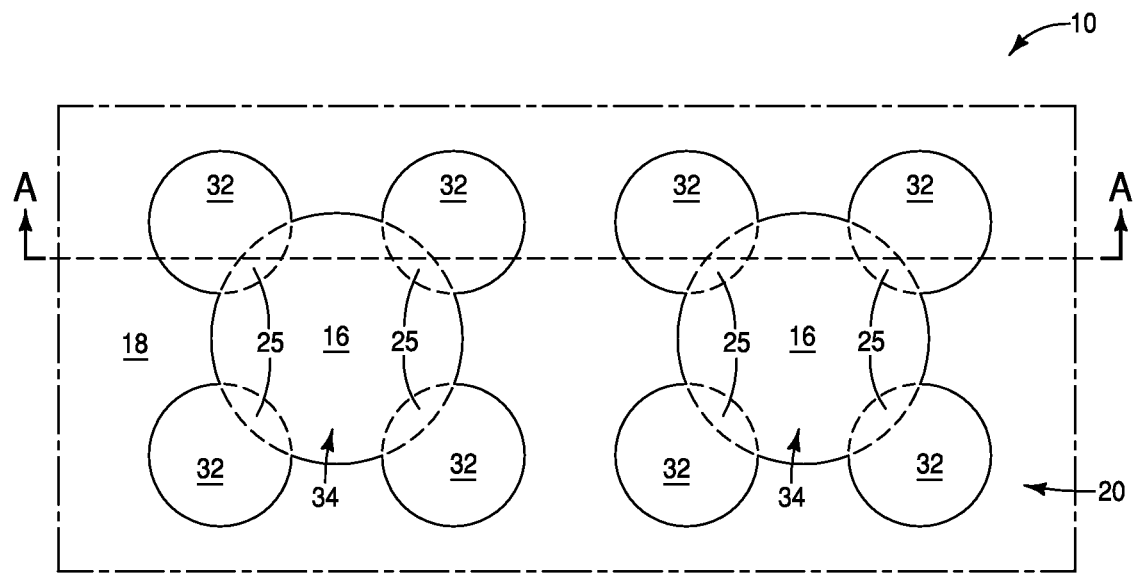
FIG. 7 is a diagrammatic top view of a region of the example assembly of FIG. 1 at an example process stage following that of FIG. 6.
Figure 7A:
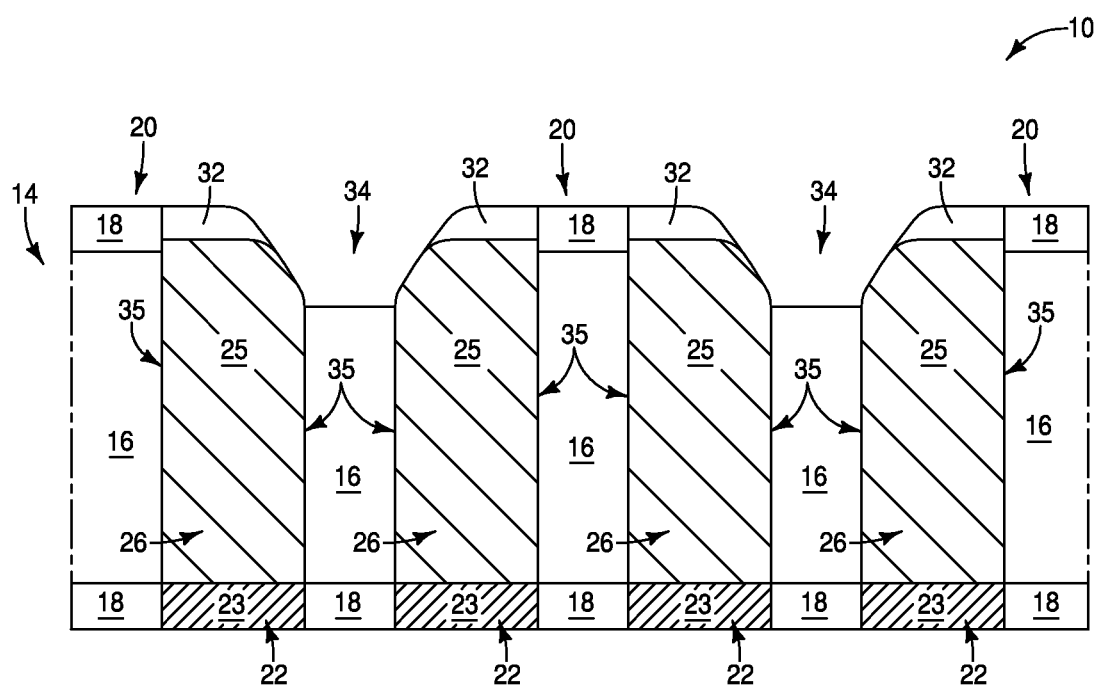
FIG. 7A is a diagrammatic cross-sectional side view of the example assembly of FIG. 7. The view of FIG. 7A is along the line A-A of FIG. 7.

Referring to FIGS. 7 and 7A, openings 34 are formed to extend through materials 18, 32 and 25, and to thereby expose regions of the sacrificial material 16. The openings 34 may be formed with any suitable combination of patterning and etches.

Figure 8:
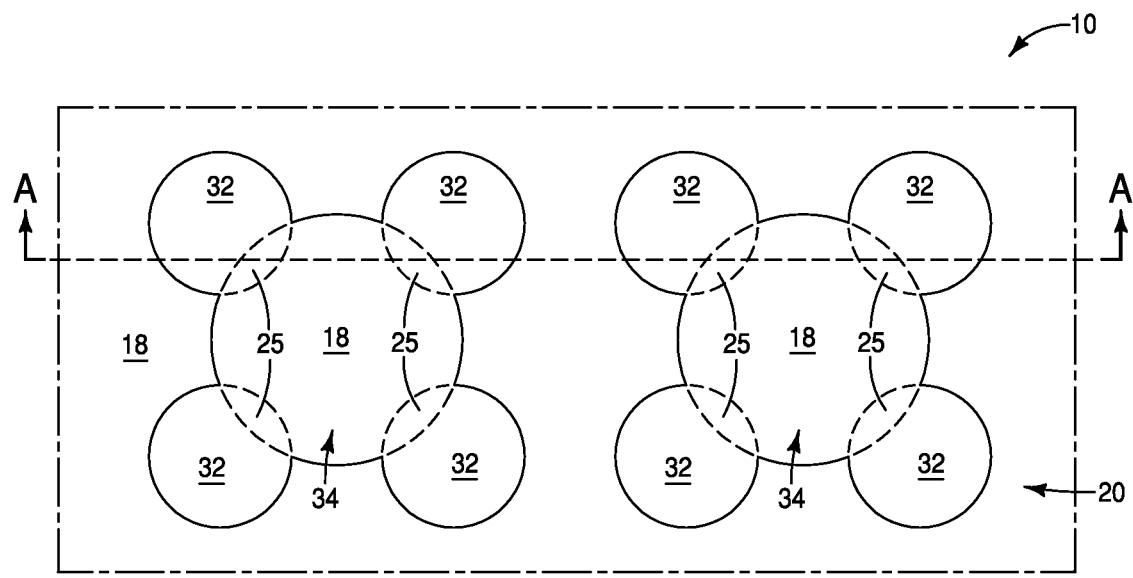
FIG. 8 is a diagrammatic top view of a region of the example assembly of FIG. 1 at an example process stage following that of FIG. 7.
Figure 8A:
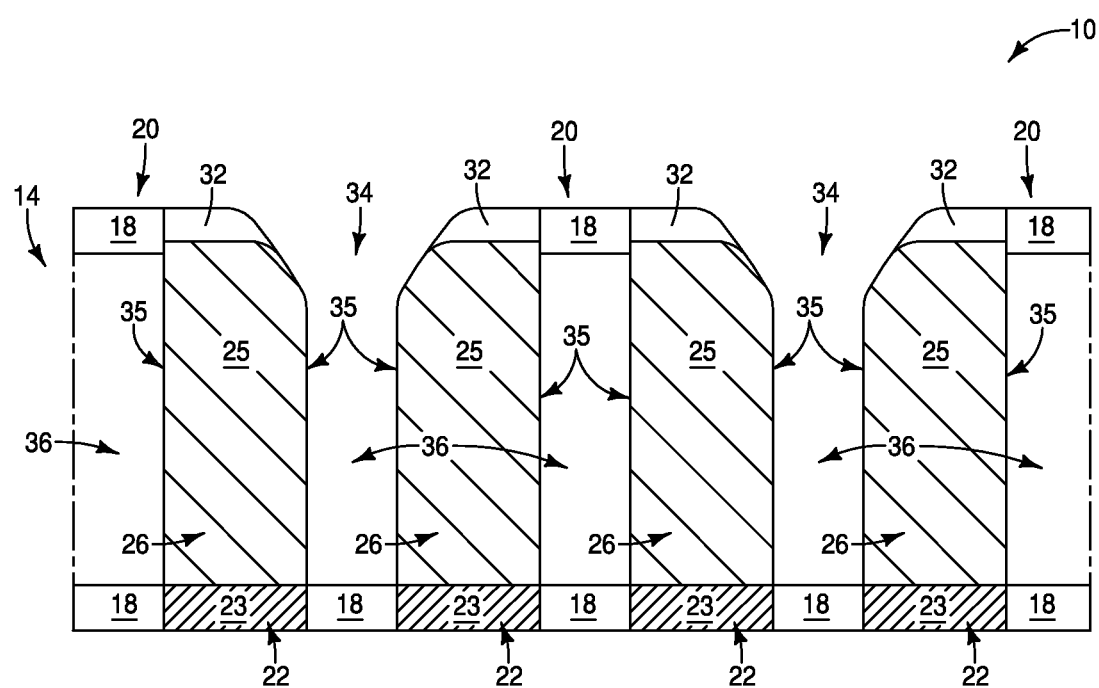
FIG. 8A is a diagrammatic cross-sectional side view of the example assembly of FIG. 8. The view of FIG. 8A is along the line A-A of FIG. 8.

Referring to FIGS. 8 and 8A, the sacrificial material 16 (FIGS. 7 and 7A) is removed to form voids 36 and expose the sidewall surfaces 35 of the conductive pillars 26. The voids 36 may be considered to be openings between neighboring conductive pillars 26.

Figure 9:
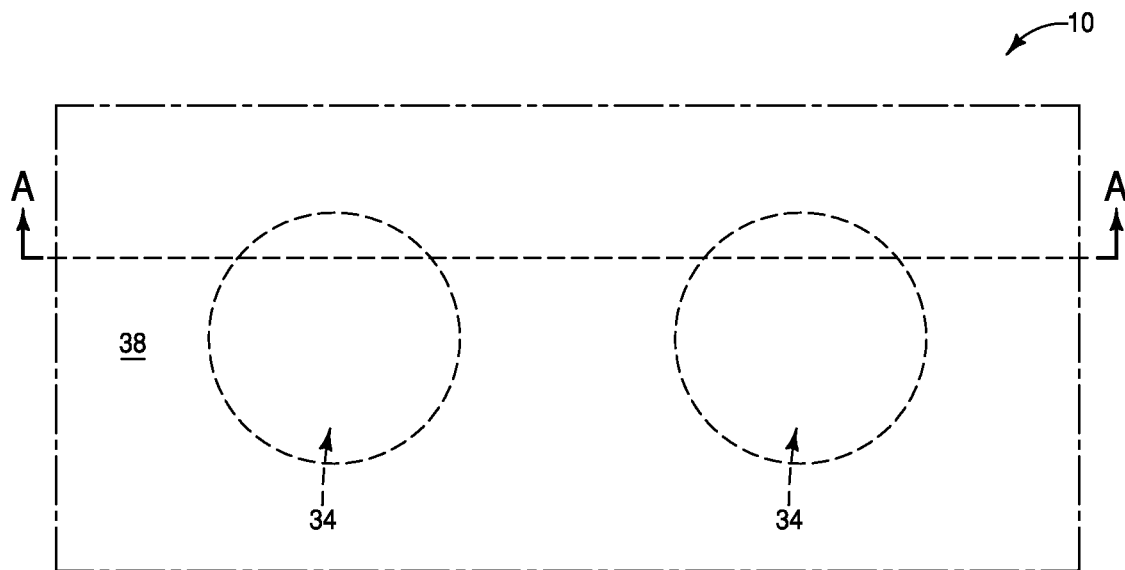
FIG. 9 is a diagrammatic top view of a region of the example assembly of FIG. 1 at an example process stage following that of FIG. 8.
Figure 9A:
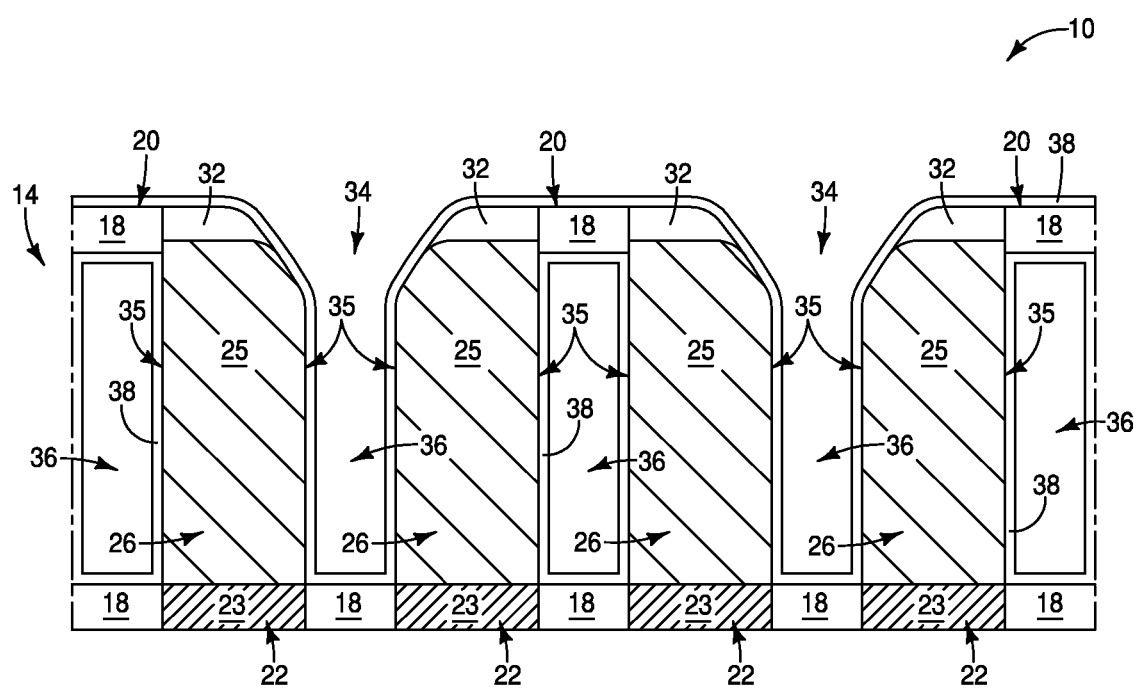
FIG. 9A is a diagrammatic cross-sectional side view of the example assembly of FIG. 9. The view of FIG. 9A is along the line A-A of FIG. 9.

Referring to FIGS. 9 and 9A, the voids (openings) 36 are lined with insulative material 38 to form the insulative material 38 along the sidewall surfaces 35 of the conductive pillars 26. The insulative material 38 may be referred to as insulative-capacitor-material, as it is ultimately utilized in a capacitor configuration. At least some of the insulative-capacitor-material 38 may comprise ferroelectric insulative material, and in some embodiments an entirety of the insulative-capacitor-material is ferroelectric insulative material.

The ferroelectric insulative material may comprise any suitable composition or combination of compositions; and in some example embodiments may include one or more of transition metal oxide, zirconium, zirconium oxide, niobium, niobium oxide, hafnium, hafnium oxide, lead zirconium titanate, and barium strontium titanate. Also, in some example embodiments the ferroelectric insulative material may have dopant therein which comprises one or more of silicon, aluminum, lanthanum, yttrium, erbium, calcium, magnesium, strontium, and a rare-earth element.

The insulative-capacitor-material 38 may be formed to any suitable thickness; and in some embodiments may have a thickness within a range of from about 30 Å to about 250 Å.

Figure 10:
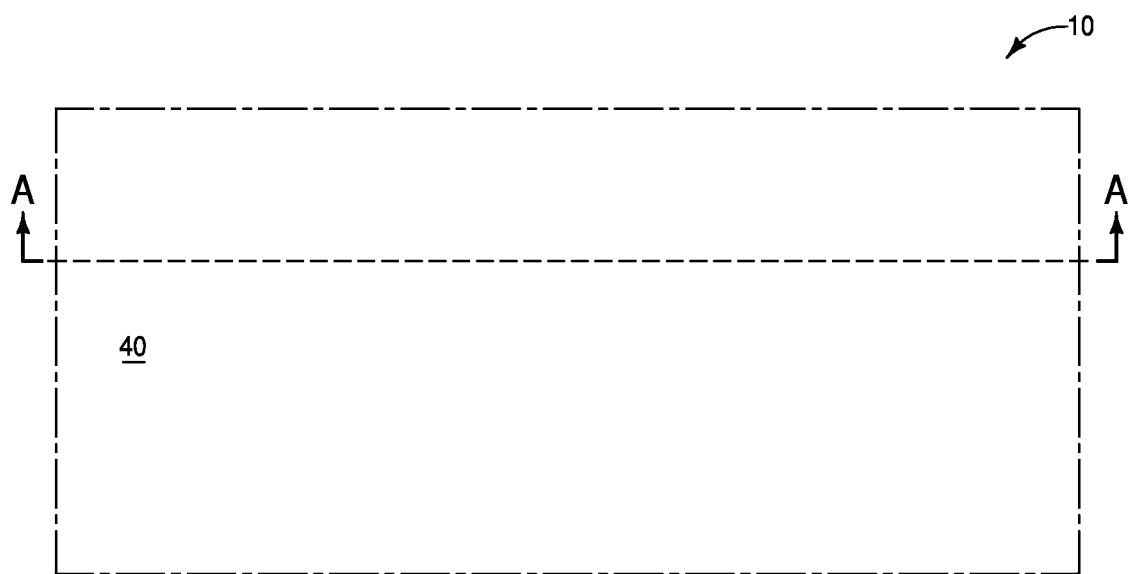
FIG. 10 is a diagrammatic top view of a region of the example assembly of FIG. 1 at an example process stage following that of FIG. 9.
Figure 10A:
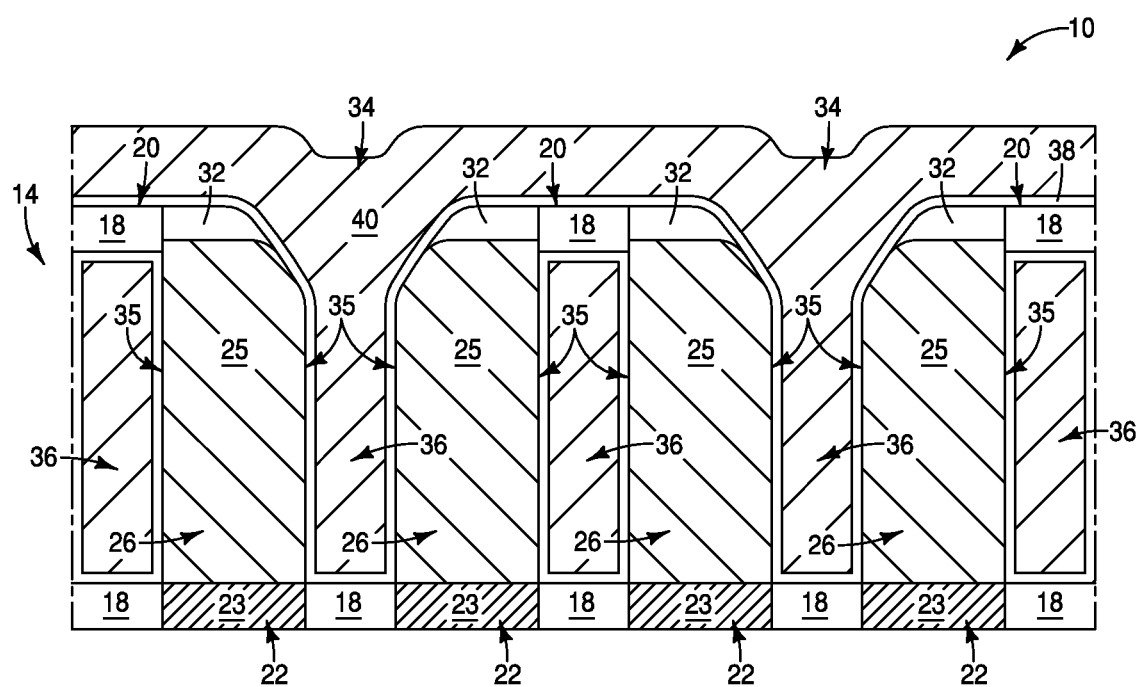
FIG. 10A is a diagrammatic cross-sectional side view of the example assembly of FIG. 10. The view of FIG. 10A is along the line A-A of FIG. 10.

Referring to FIGS. 10 and 10A, conductive material 40 is formed within the lined voids (openings) 36. The conductive material 40 is ultimately utilized to form electrodes of capacitors; and may be referred to as electrode material, as capacitor-electrode-material, as second-capacitor-electrode-material, or as second-electrode-material. The electrode material 40 may comprise any suitable composition or combination of combinations; such as, for example, one or more of various metals (e.g., titanium, tungsten, cobalt, ruthenium, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrode material 40 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten.

Figure 11:
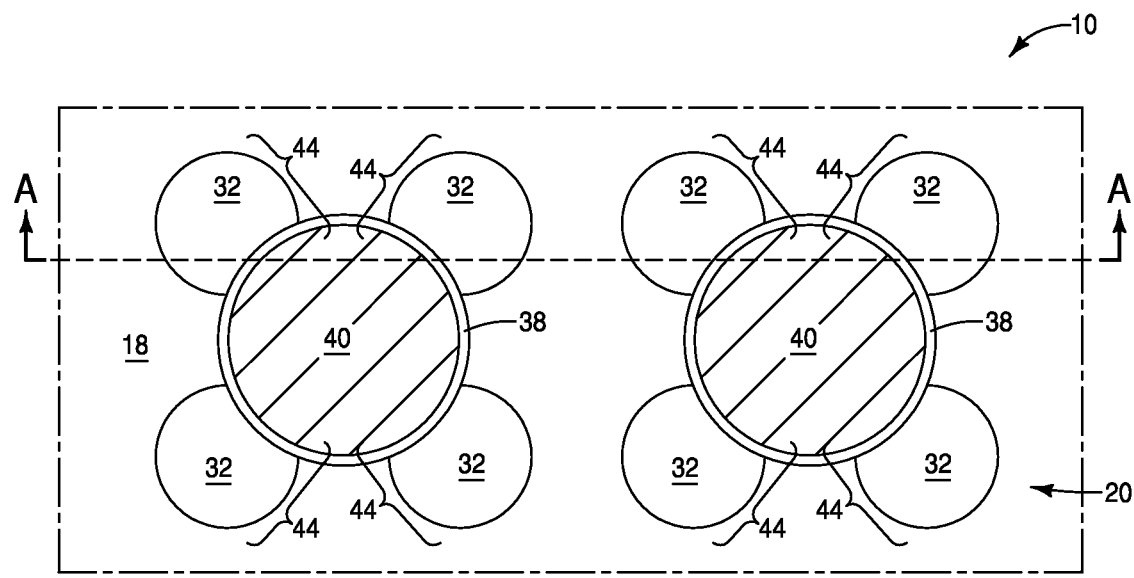
FIG. 11 is a diagrammatic top view of a region of the example assembly of FIG. 1 at an example process stage following that of FIG. 10.
Figure 11A:
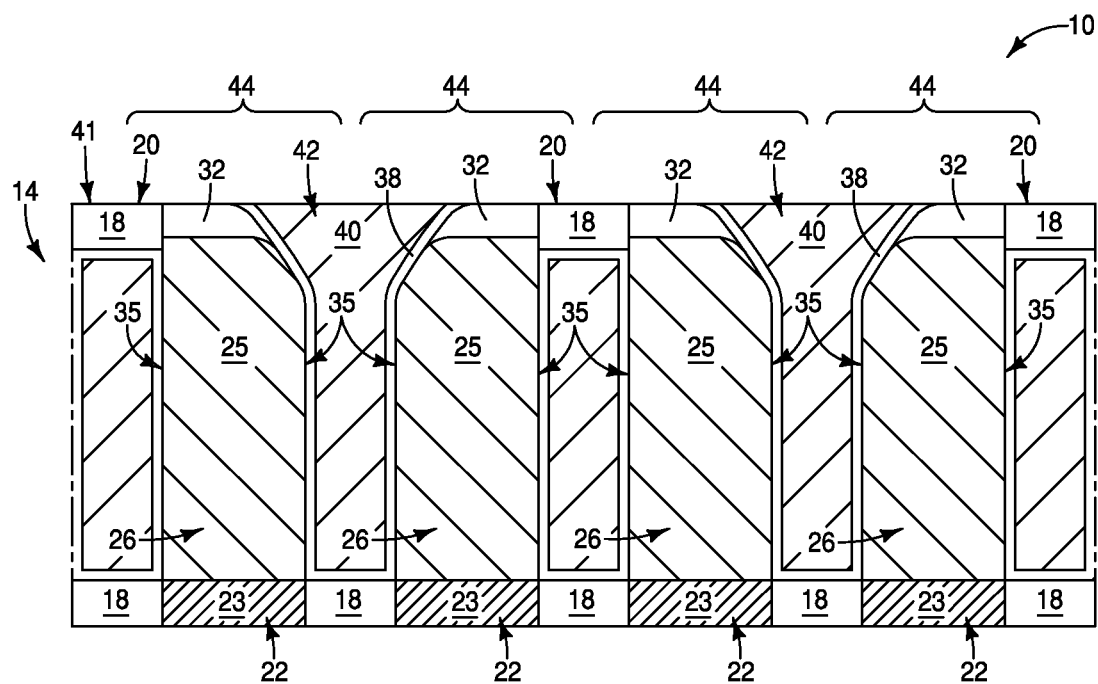
FIG. 11A is a diagrammatic cross-sectional side view of the example assembly of FIG. 11. The view of FIG. 11A is along the line A-A of FIG. 11.

Referring to FIGS. 11 and 11A, the assembly 10 is subjected to planarization (e.g., CMP) to form a planarized surface 41 extending across the materials 18, 32, 38 and 40. Such patterns the material 40 into capacitor electrodes 42. In some embodiments, the pillars 26 may be referred to as first-capacitor-electrodes (or as first electrodes), and the electrodes 42 may be referred to as second-capacitor-electrodes (or as second electrodes). The second-capacitor-electrodes are laterally between the first-capacitor-electrodes (i.e., are laterally between the vertically-extending pillars 26), and are spaced from the first-capacitor-electrodes by the insulative material 38.

The first-capacitor-electrodes 26 and second-capacitor-electrodes 42, together with the insulative-capacitor-material 38, form a plurality of capacitors 44. Each capacitor has a single pillar 26, and shares a second-capacitor-electrode 42 with other neighboring capacitors.

Figure 12:
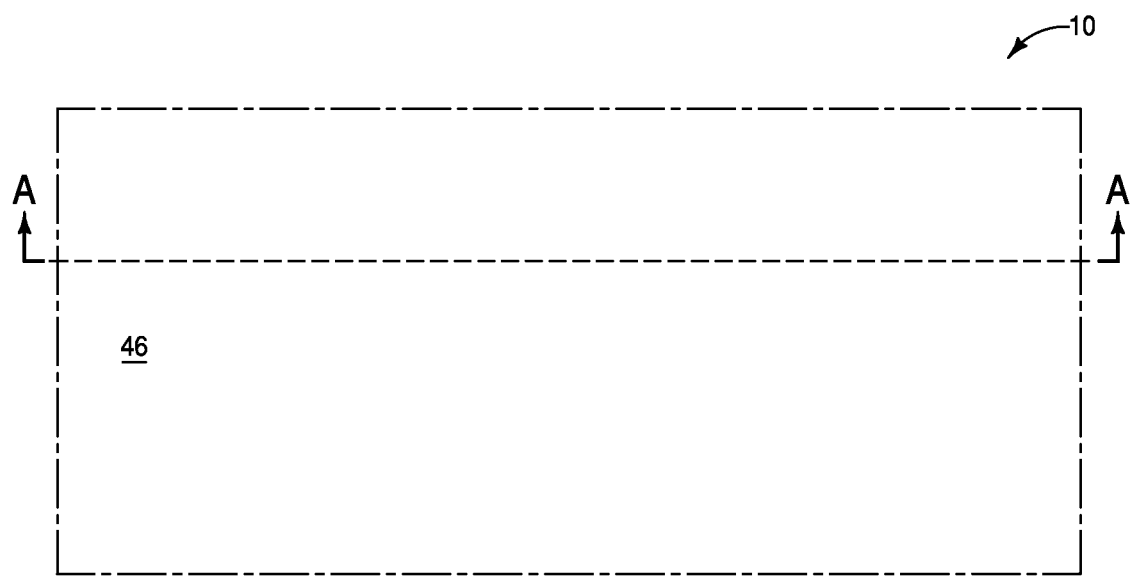
FIG. 12 is a diagrammatic top view of a region of the example assembly of FIG. 1 at an example process stage following that of FIG. 11.
Figure 12A:
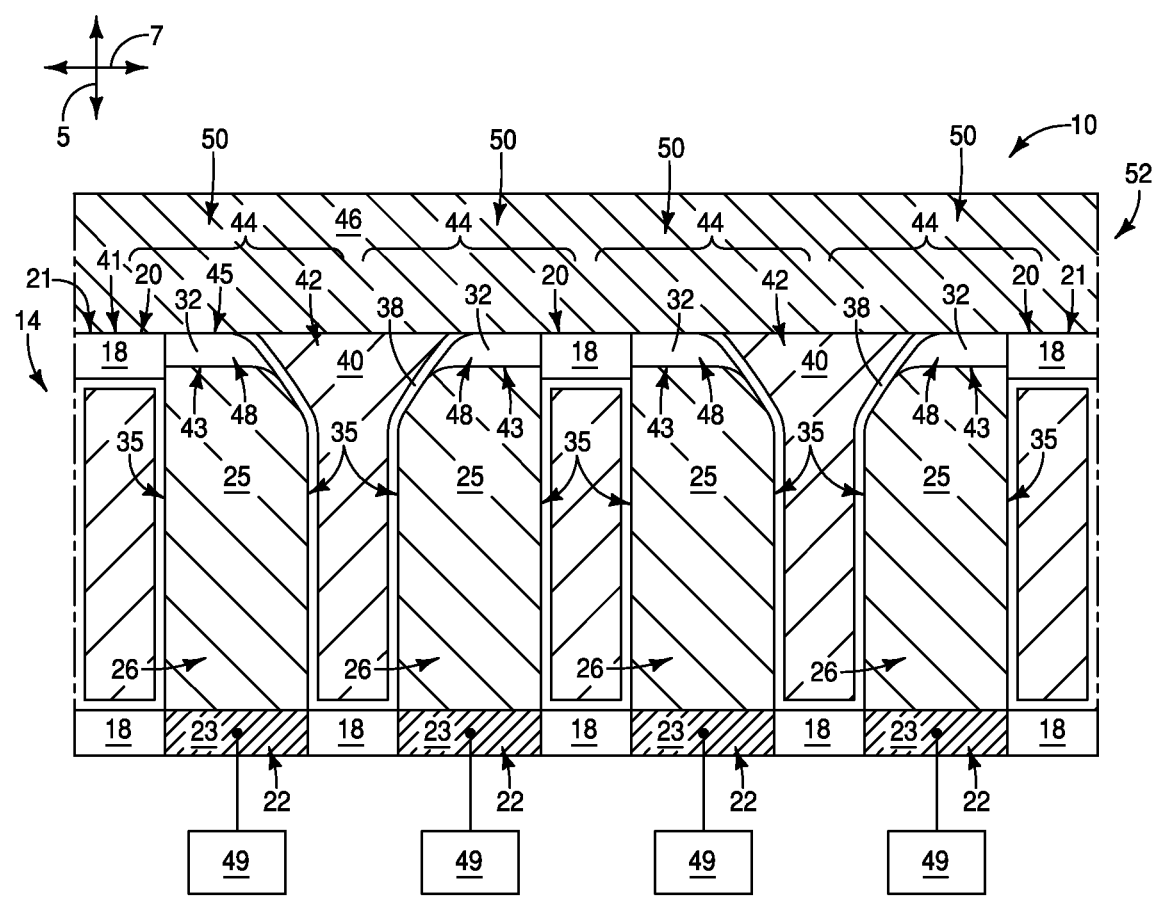
FIG. 12A is a diagrammatic cross-sectional side view of the example assembly of FIG. 12. The view of FIG. 12A is along the line A-A of FIG. 12.

Referring to FIGS. 12 and 12A, conductive-plate-material 46 is formed across the planarized upper surface 41. The conductive-plate-material 46 is electrically coupled with the capacitor-electrode-material 40, and with the leaker-device-material 32.

The conductive-plate-material 46 may comprise any suitable electrically conductive materials, such as, for example, one or more of various metals (e.g., titanium, tungsten, cobalt, nickel, ruthenium, platinum, etc.), metal-containing compositions (e.g., metal silicide, metal nitride, metal carbide, etc.), and/or conductively-doped semiconductor materials (e.g., conductively-doped silicon, conductively-doped germanium, etc.). The conductive-plate-material 46 may comprise a different composition than the electrodes 42. For instance, in some embodiments the electrodes 42 may comprise, consist essentially of, or consist of TiSiN and/or TiN (where the chemical formulas list primary compositions rather than specific stoichiometries), and the conductive-plate-material 46 may comprise, consist essentially of, or consist of tungsten.

The leaker-device-material 32 is configured as leaker-devices 48 which electrically couple the first electrodes 26 of the capacitors 44 with the conductive-plate-material 46 to enable discharge of at least a portion of any excess charge from the first electrodes 26 to the conductive-plate-material 46. In some embodiments, electrical resistance of the leaker-devices 48 is tailored so that the leaker-devices 48 have appropriate conductivity to remove excess charge from the first electrodes 26 while having low enough conductivity (e.g., high enough resistance) so that the leaker-devices 48 do not undesirably electrically short the first electrodes 26 to the conductive-plate-material 46. In the embodiment of FIG. 12A, the leaker-devices 48 are horizontally elongated. For instance, the pillars 26 may be considered to extend along (i.e., to be elongated along) a vertical axis shown as an axis 5, and the leaker-devices 48 may be considered to be elongated along a horizontal axis shown as an axis 7. Each of the leaker-devices 48 has a bottom surface 43 directly against the conductive material 25 of a first electrode, and has an upper surface 45 directly against the conductive-plate-material 46. In the shown embodiment, the upper surfaces 45 of the leaker-devices 48 are substantially coplanar with the upper surface 21 of the horizontally-extending beam 20 of insulative-lattice-material 18; with the term "substantially coplanar" meaning coplanar to within reasonable tolerances of fabrication and measurement.

In some embodiments, the capacitors 44 may be incorporated into memory cells 50 (such as, for example, ferroelectric memory cells) by coupling the capacitors with appropriate circuit components. For instance, access transistors 49 are diagrammatically illustrated in FIG. 12A as being coupled to the first electrodes 26 through the conductive contacts (i.e., conductive interconnects) 22. The transistors 49, and/or other suitable components, may be fabricated at any suitable process stage. For instance, in some embodiments the transistors 49 may be fabricated at a process stage prior to the illustrated process stage of FIG. 1.

The memory cells 50 may be part of a memory array 52; such as, for example, a FeRAM (Ferroelectric Random Access Memory) array.

In some embodiments, the leaker-devices 48 may be considered to be resistive interconnects coupling electrodes 26 within memory cells 50 to the conductive-plate-material 46 (which may be referred to as a plate line or as a plate structure). If the leaker-devices are too leaky, then one or more memory cells may experience cell-to-cell disturb. If the leaker-devices 48 are not leaky (conductive) enough, then excess charge from the electrodes 26 will not be drained. Persons of ordinary skill in the art will recognize how to calculate the resistance needed for the leaker-devices 48 for a given memory array. In some embodiments, the leaker-devices 48 may have resistance within a range of from about 0.1 megaohms to about 5 megaohms. Factors such as separation between adjacent memory cells, the insulative (dielectric) material used between the memory cells, physical dimensions of the memory cells, the amount of charge placed in the memory cells, a size of the memory array, a frequency of operations conducted by the memory array, etc., may be considered when making a determination of the resistance appropriate for the leaker-devices 48.

FIGS. 1-12 describe an example method for fabricating example capacitors. Another example method for fabricating example capacitors is described with reference to FIGS. 13-19.

Figure 13:
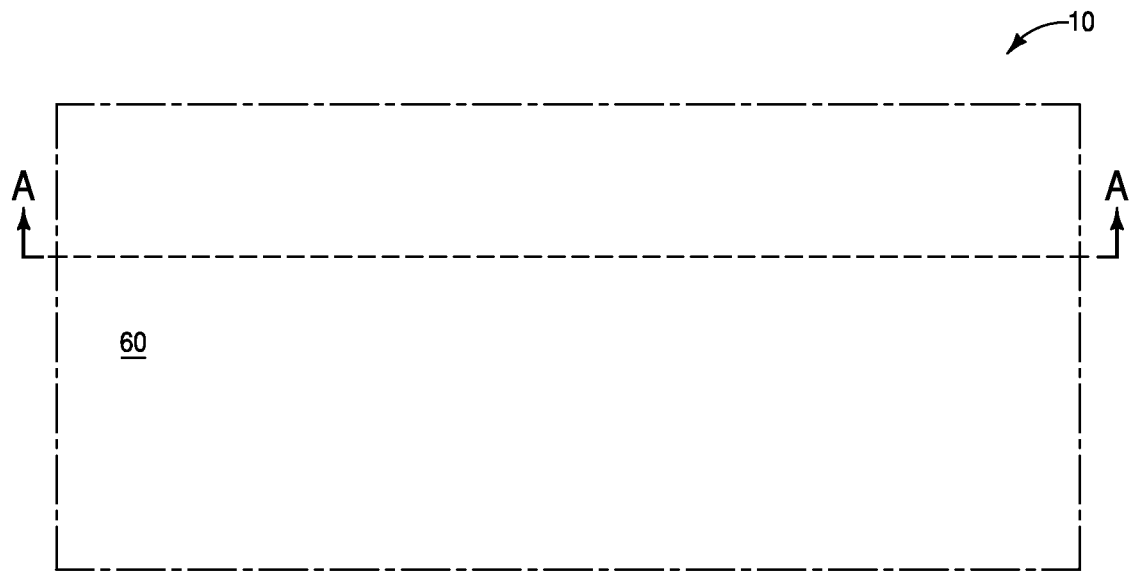
FIG. 13 is a diagrammatic top view of a region of an example assembly at an example process stage of an example method for forming an example integrated structure. The process stage of FIG. 13 may follow that of FIG. 4.
Figure 13A:
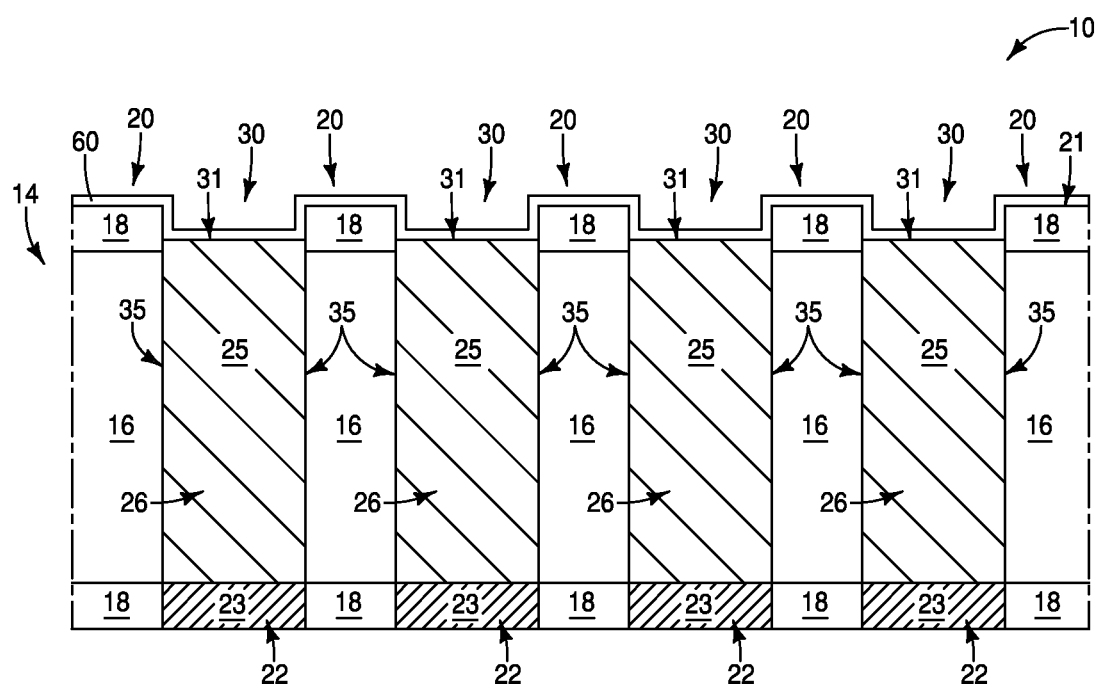
FIG. 13A is a diagrammatic cross-sectional side view of the example assembly of FIG. 13. The view of FIG. 13A is along the line A-A of FIG. 13.

Referring to FIGS. 13 and 13A, the assembly 10 is shown at a process stage which may be follow that of FIGS. 4 and 4A. The upper surfaces 31 of the conductive pillars 26 have then recessed relative to the upper surface 21 of the insulative-lattice-material 18 to form the recesses 30. An undulating topography extends into the recesses 30 and across the top surface of the insulative-lattice-material 18. A material 60 is formed across the undulating topography. The material 60 may comprise leaker-device-material identical to the material 32 described above with reference to FIGS. 5 and 5A. Alternatively, the material 60 may comprise a precursor of the leaker-device-material; and in some embodiments may comprise a material which will become leaker-device-material upon oxidation. For instance, the material 60 may be a precursor which comprises, consist essentially of, or consist of titanium and nitrogen (for instance, titanium nitride); and which upon oxidation becomes a leaker-device-material 32 comprising, consisting essentially of, or consisting of titanium, nitrogen and oxygen. In the embodiment described herein, the material 60 will be referred to as a precursor material.

The precursor material 60 may be formed to any suitable thickness. In some embodiments, the precursor material 60 may be a continuous layer having a thickness within a range of from about 2 Å to about 20 Å. The precursor material 60 may be continuous (as shown), or may be discontinuous.

Figure 14:
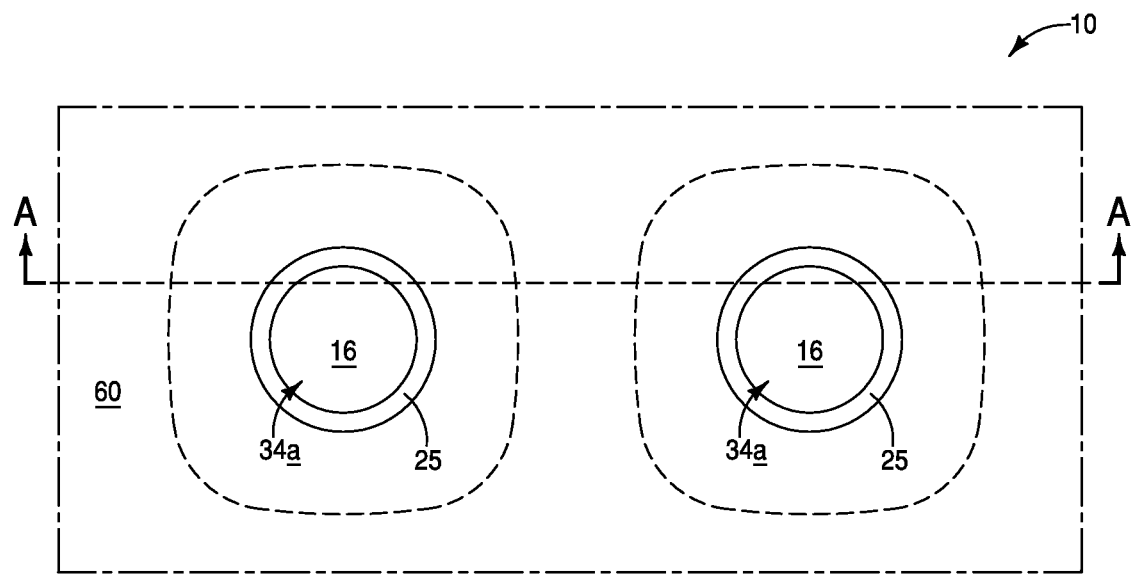
FIG. 14 is a diagrammatic top view of a region of the example assembly of FIG. 13 at an example process stage following that of FIG. 13.
Figure 14A:
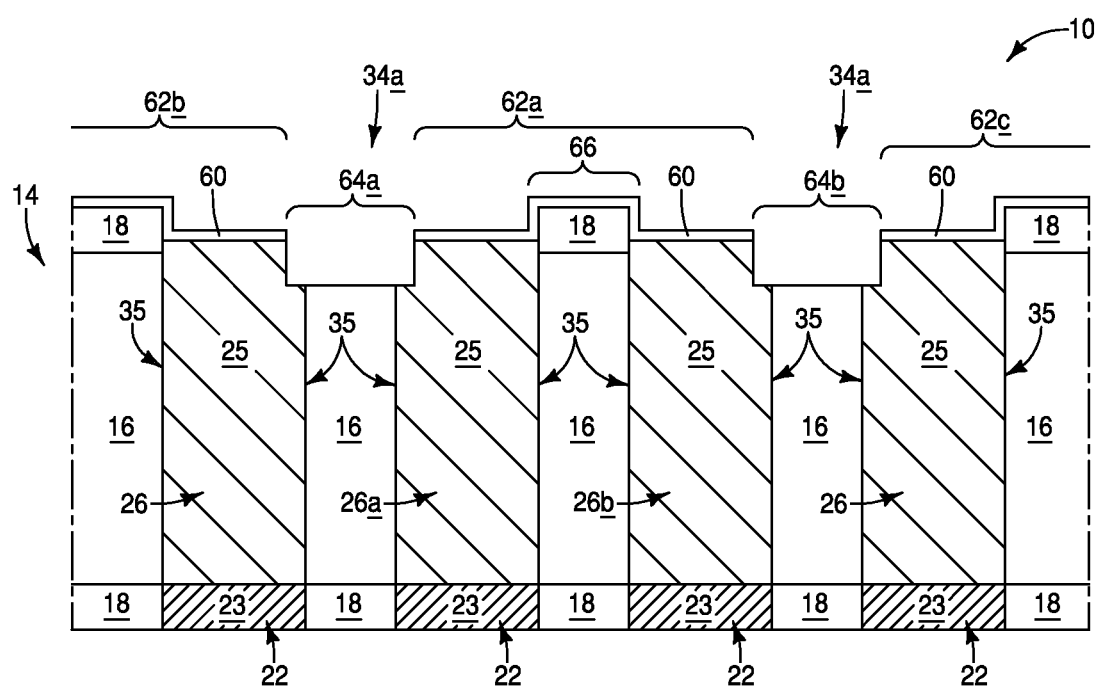
FIG. 14A is a diagrammatic cross-sectional side view of the example assembly of FIG. 14. The view of FIG. 14A is along the line A-A of FIG. 14.

Referring to FIGS. 14 and 14A, openings 34a are formed to expose regions of the sacrificial material 16. In some embodiments, the formation of the openings 34a may be considered to comprise punching through regions of the precursor material 16 and the insulative-lattice-material 18. Segments of the precursor material 60 remain over the pillars 26 after the formation of the openings 34a.

In the shown embodiment of FIG. 14A, the conductive pillars 26 may be considered to be arranged in pairs; with two of the pillars being labeled as 26a and 26b, and being in a paired relationship with one another. The paired pillars 26a and 26b may be considered together to form a paired-neighboring-pillar-structure 62a. Portions of other paired-neighboring-pillar-structures 62b and 62c are shown in FIG. 14A to be proximate the structure 62a, and to be spaced from the structure 62a by intervening gaps 64a and 64b. The processing stage of FIG. 14A has removed regions of the precursor material 60 and the insulative-lattice-material 18 from the intervening gaps 34a and 34b, while leaving regions of the precursor material 60 and the insulative-lattice-material 18 between the conductive pillars of the paired-neighboring-pillar-structures (e.g., between the conductive pillars 26a and 26b). The remaining regions of the precursor material 60 and the insulative-lattice-material 18 may be considered to be part of the paired-neighboring-pillar-structures. For instance, the paired-neighboring-pillar-structure 62a comprises a portion 66 which includes precursor material 60 and insulative-lattice-material 18.

Figure 15:
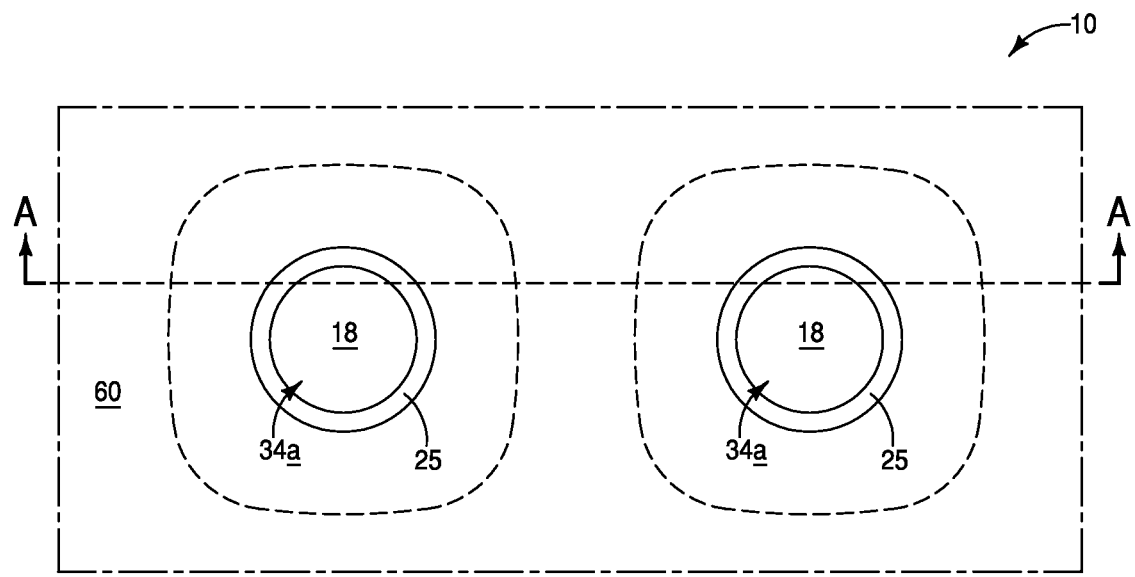
FIG. 15 is a diagrammatic top view of a region of the example assembly of FIG. 13 at an example process stage following that of FIG. 14.
Figure 15A:
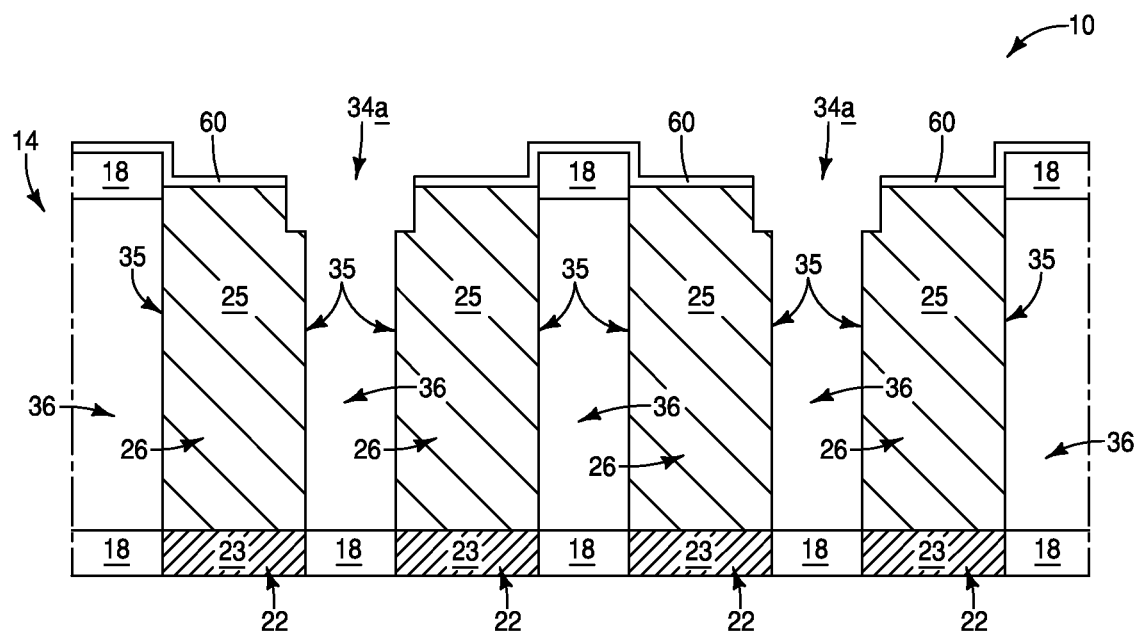
FIG. 15A is a diagrammatic cross-sectional side view of the example assembly of FIG. 15. The view of FIG. 15A is along the line A-A of FIG. 15.

Referring to FIGS. 15 and 15A, the sacrificial material 16 is removed to leave the voids (openings) 36.

Figure 16:
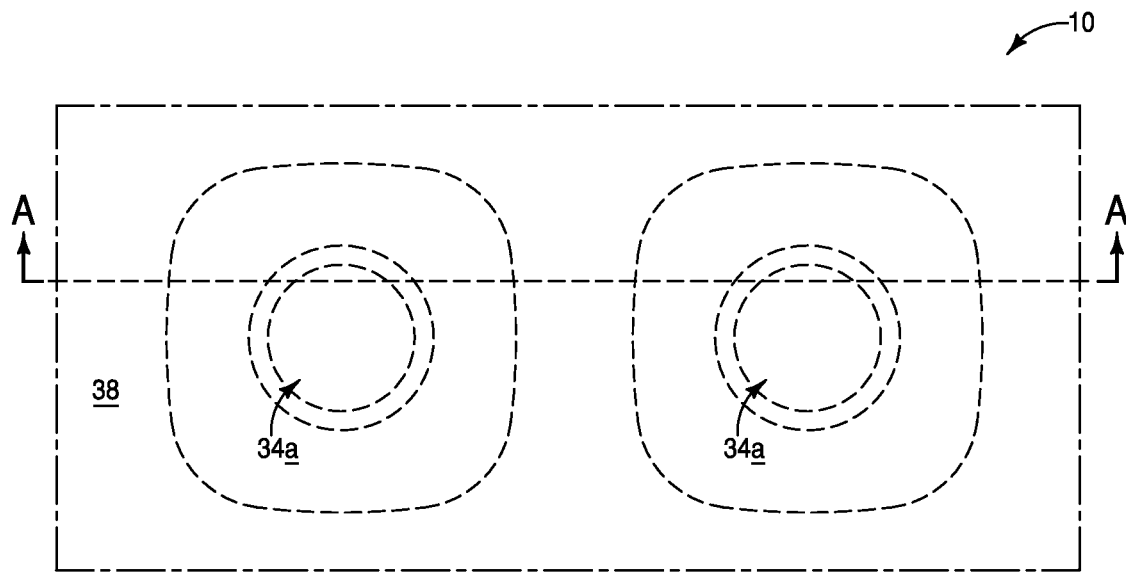
FIG. 16 is a diagrammatic top view of a region of the example assembly of FIG. 13 at an example process stage following that of FIG. 15.
Figure 16A:
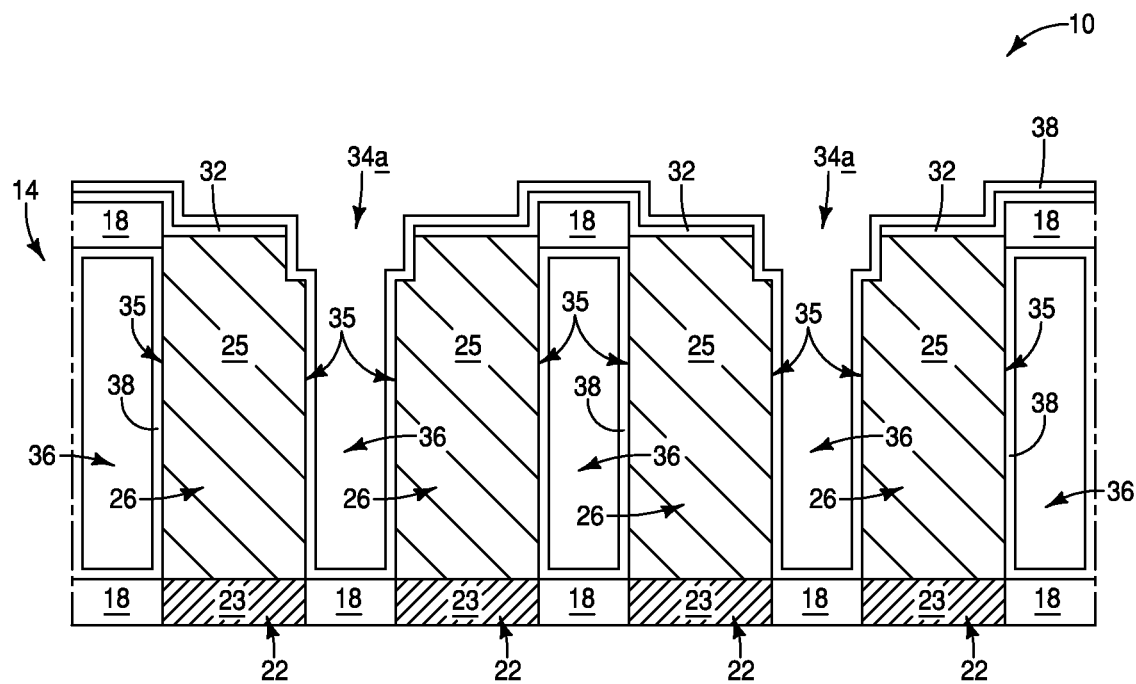
FIG. 16A is a diagrammatic cross-sectional side view of the example assembly of FIG. 16. The view of FIG. 16A is along the line A-A of FIG. 16.

Referring to FIGS. 16 and 16A, the insulative material 38 is formed to line the voids 36 with processing analogous that described above with reference to FIGS. 9 and 9A. The insulative material may be formed utilizing oxidizing conditions (e.g., utilizing one or more of $O_2$, $O_3$, $H_2O_2$, etc., with or without plasma) In the shown embodiment, the formation of the insulative material 38 oxidizes the precursor material 60 (FIGS. 15 and 15A) to convert such material to the leaker-device-material 32. In some embodiments, the resulting leaker-device-material 32 may be a continuous layer having a thickness within a range of from about 2 Å to about 20 Å. In some embodiments, the leaker-device-material 32 may be a continuous layer having a thickness within a range of from about 6 Å to about 15 Å. In some embodiments, the leaker-device-material 32 of FIGS. 16 and 16A may be discontinuous.

Figure 17:
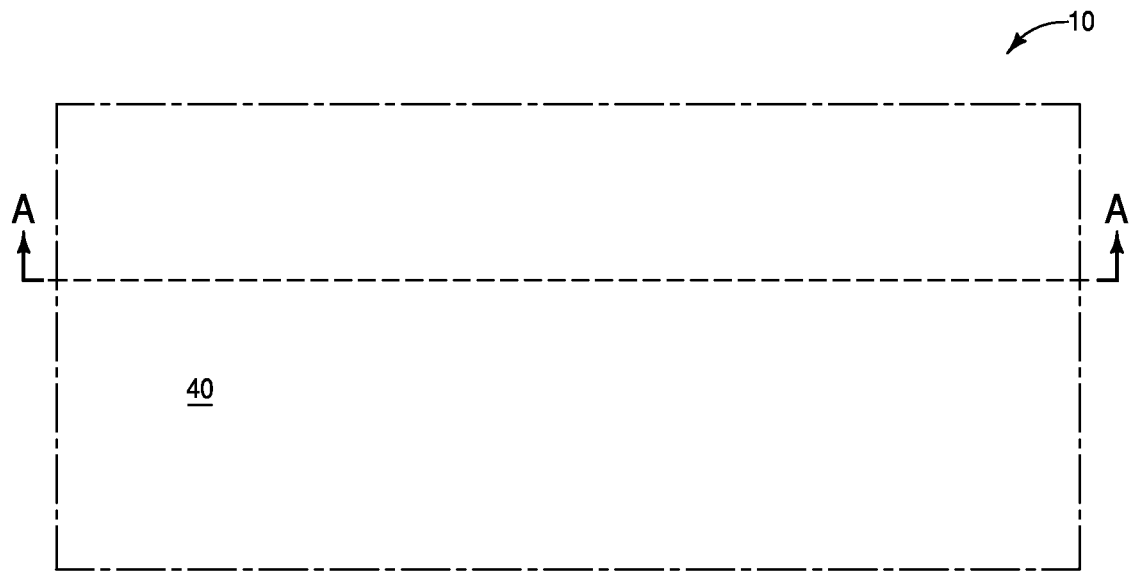
FIG. 17 is a diagrammatic top view of a region of the example assembly of FIG. 13 at an example process stage following that of FIG. 16.
Figure 17A:
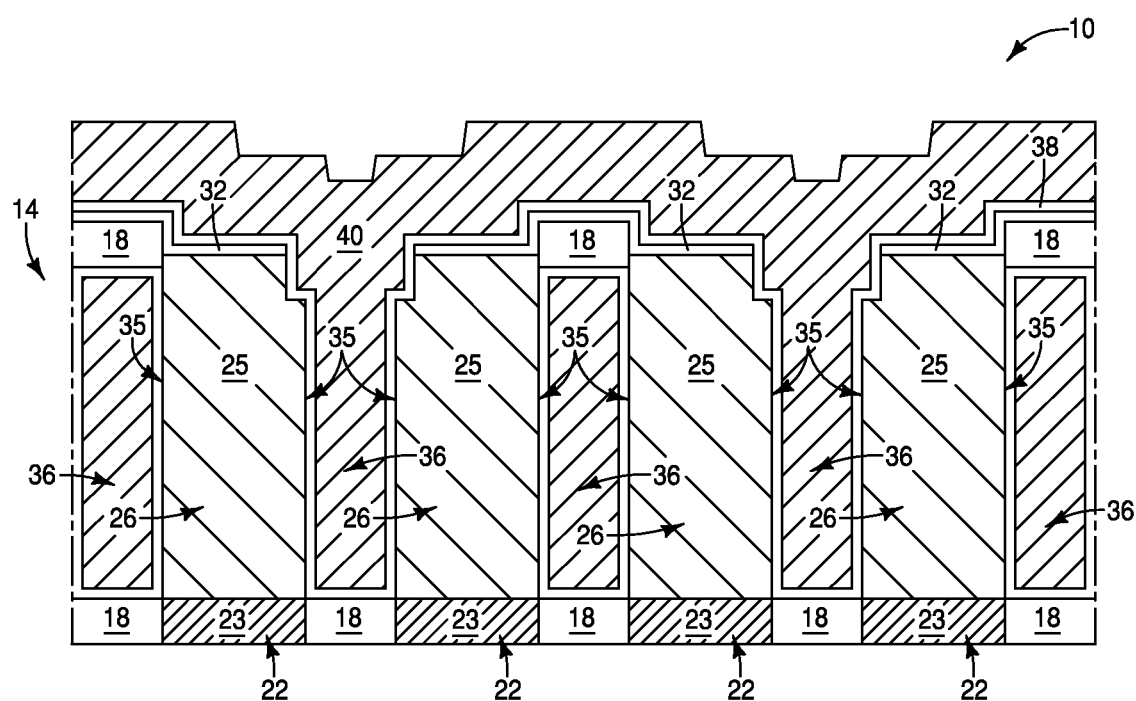
FIG. 17A is a diagrammatic cross-sectional side view of the example assembly of FIG. 17. The view of FIG. 17A is along the line A-A of FIG. 17.

Referring to FIGS. 17 and 17A, the electrode material 40 is formed to fill the lined voids 36 with processing analogous that described above with reference to FIGS. 10 and 10A.

Figure 18:
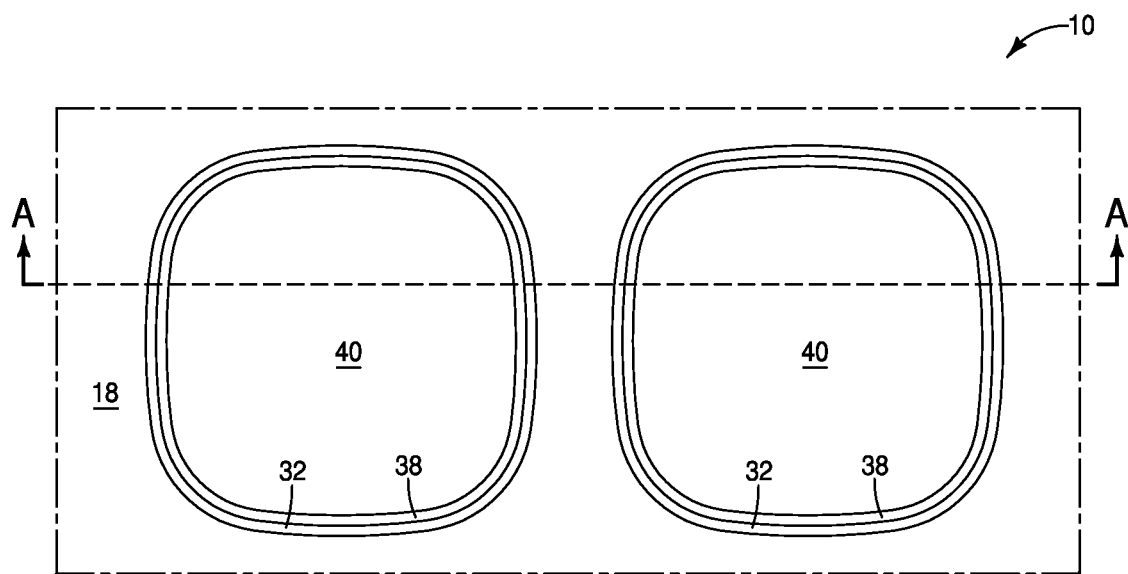
FIG. 18 is a diagrammatic top view of a region of the example assembly of FIG. 13 at an example process stage following that of FIG. 17.
Figure 18A:
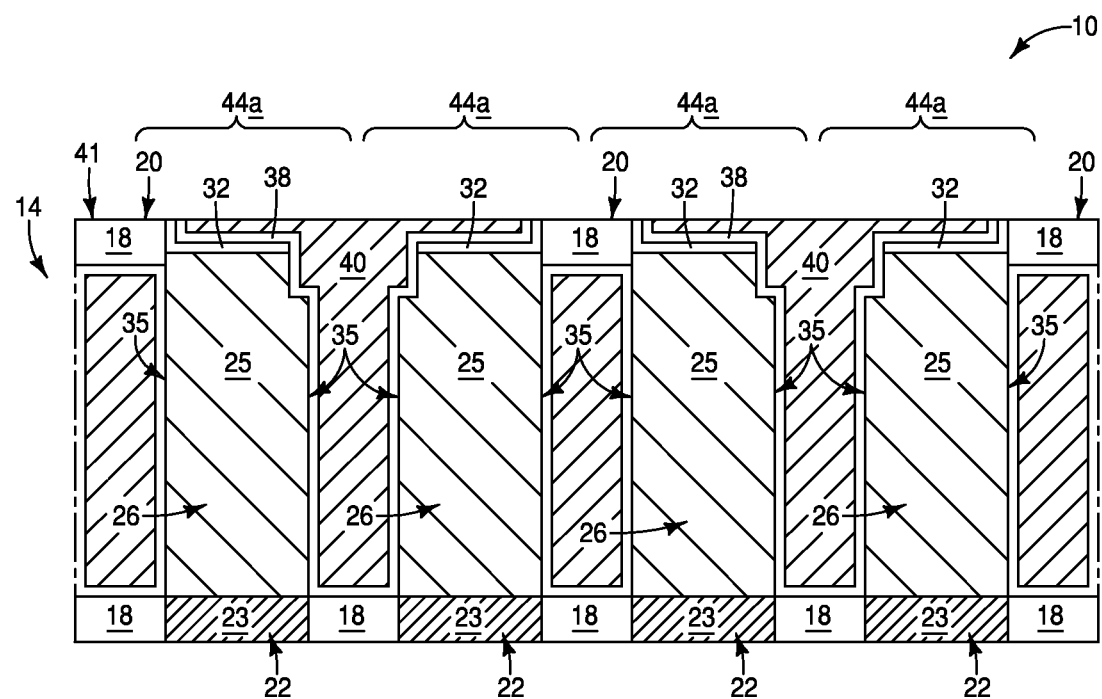
FIG. 18A is a diagrammatic cross-sectional side view of the example assembly of FIG. 18. The view of FIG. 18A is along the line A-A of FIG. 18.

Referring to FIGS. 18 and 18A, planarization is conducted to form the planarized surface 41 with processing analogous that described above with reference to FIGS. 11 and 11A. Such forms capacitors 44a analogous to the capacitors 44 described above with reference to FIGS. 11 and 11A.

Figure 19:
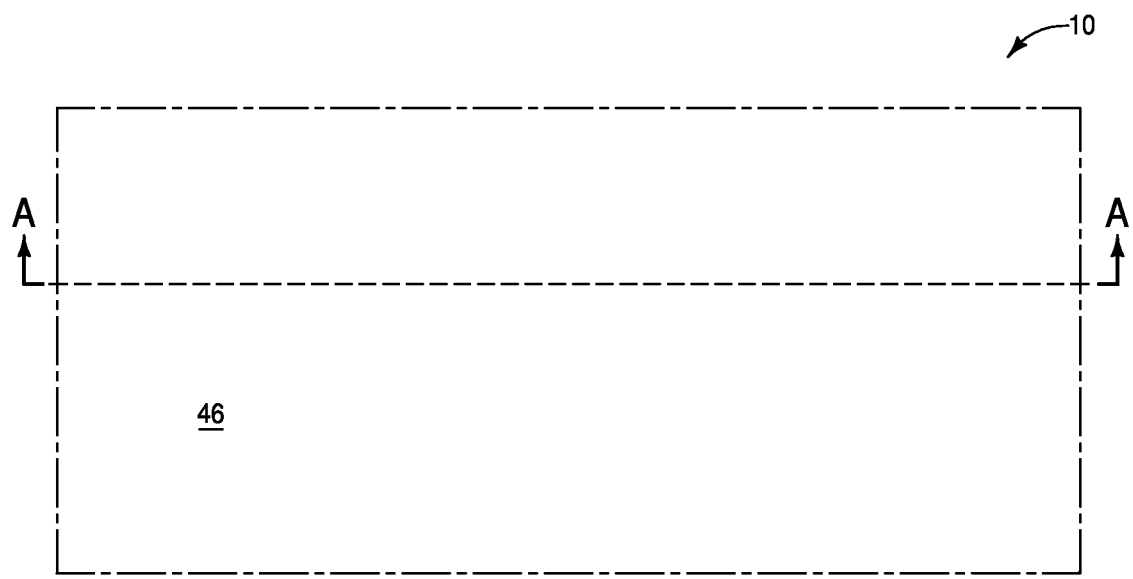
FIG. 19 is a diagrammatic top view of a region of the example assembly of FIG. 13 at an example process stage following that of FIG. 18.
Figure 19A:
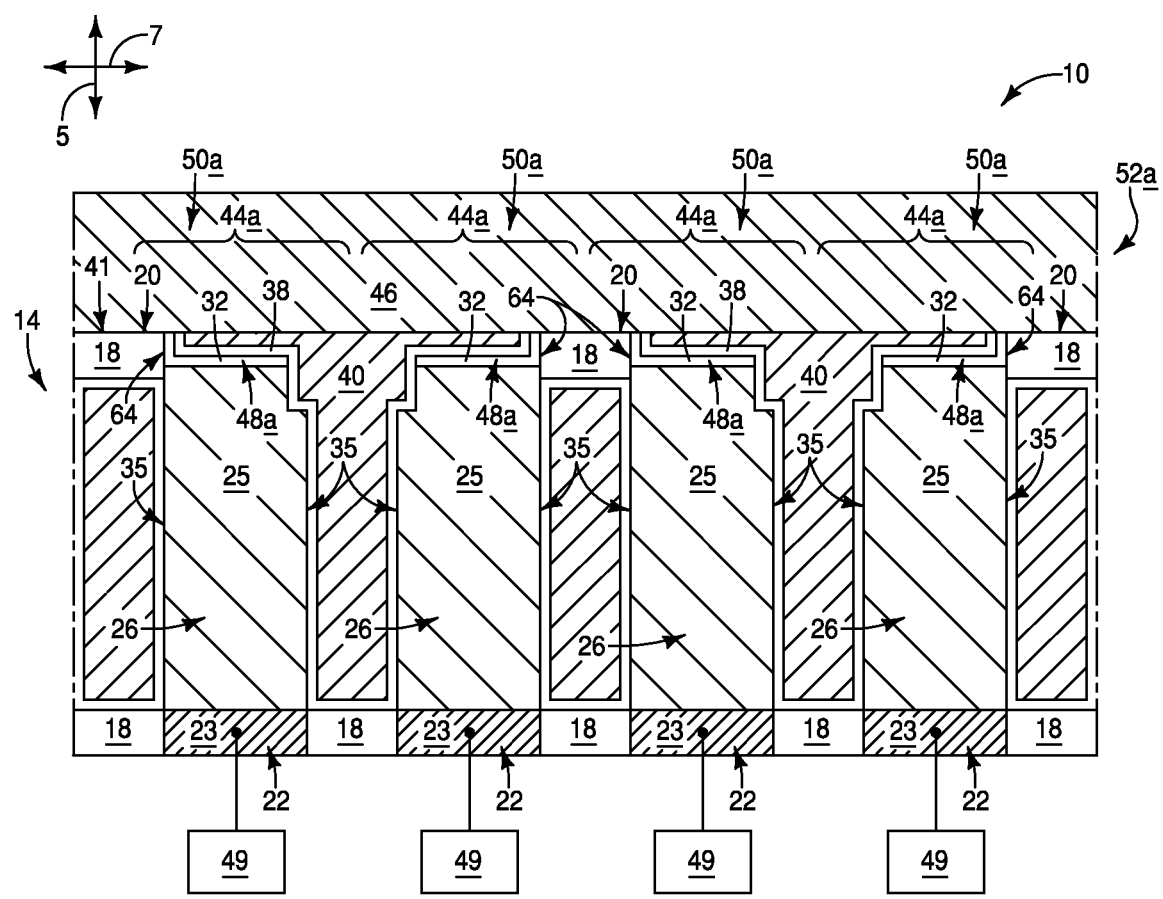
FIG. 19A is a diagrammatic cross-sectional side view of the example assembly of FIG. 19. The view of FIG. 19A is along the line A-A of FIG. 19.

Referring to FIGS. 19 and 19A, the conductive-plate-material 46 is formed across upper surfaces of the capacitors 44a. The capacitors 44a are incorporated into memory cells 50a analogous to the memory cells 50 described above with reference to FIGS. 12 and 12A; and such memory cells 50a are incorporated into a memory array 52a.

The leaker-device-material 32 of FIG. 19A is similar to that of FIG. 12A, and forms leaker-devices 48a which couple the electrodes 26 to the conductive-plate-material 46. The leaker-devices 48a of FIG. 19A differ from devices 48 of FIG. 12A in that the devices 48a include vertically-elongated structures 64 which extend upwardly from the top surfaces of the pillars 26.

Figure 20:
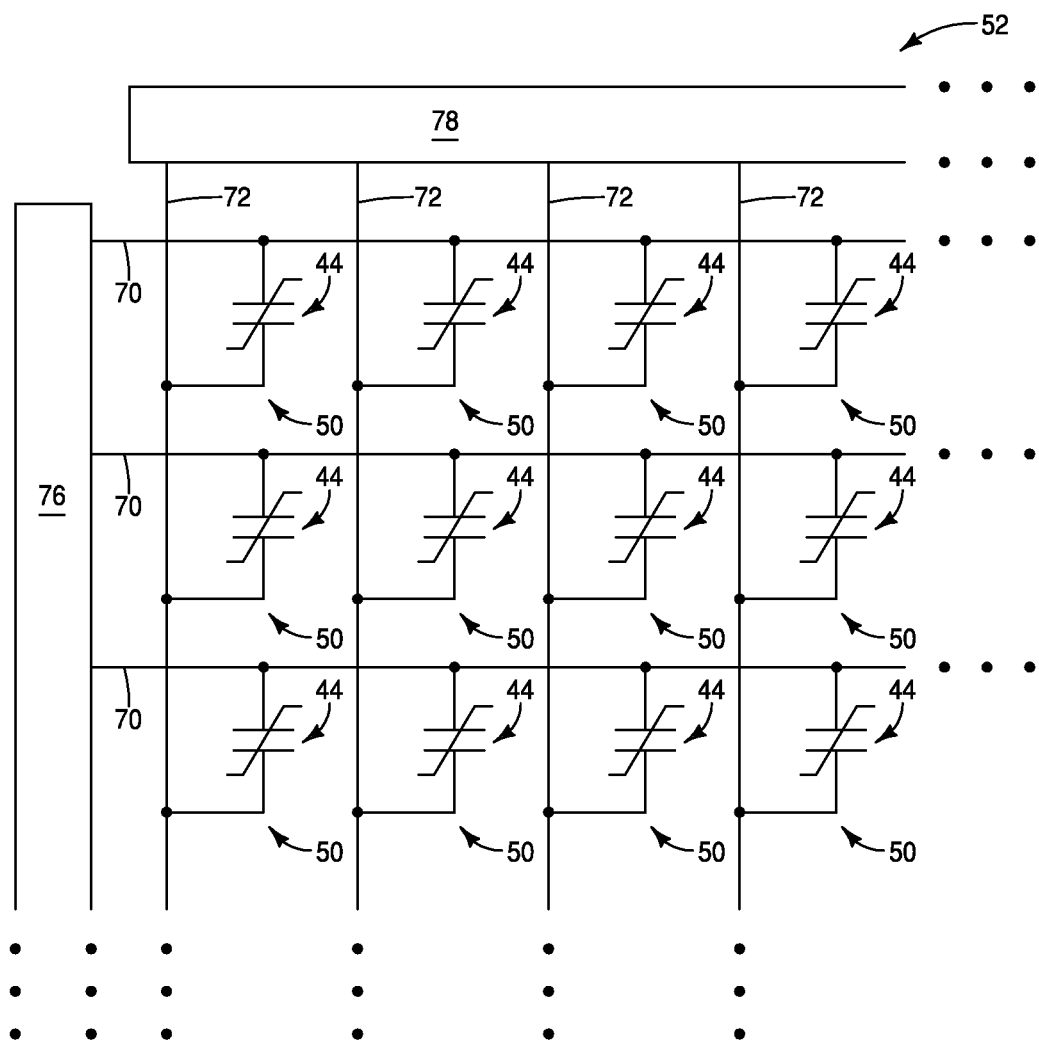
FIG. 20 is a schematic diagram of an example memory array comprising ferroelectric capacitors.

The memory arrays described above (memory array 52 of FIG. 12 and memory array 52a of FIG. 19) may be ferroelectric memory arrays, and may have any suitable configuration. An example ferroelectric memory array is described with reference to FIG. 20. The memory array of FIG. 20 is specifically described as a memory array 52, but could alternatively be a memory array 52a. The memory array of FIG. 20 includes a plurality of substantially identical ferroelectric capacitors 44 (which would be capacitors 44a if the memory array were the memory array 52a). Wordlines 70 extend along rows of the memory array, and digit lines 72 extend along columns of the memory array. Each of the capacitors 44 is within a memory cell 50 which is uniquely addressed utilizing a combination of a wordline and a digit line. The wordlines 70 extend to driver circuitry 76, and the digit lines 72 extend to detecting circuitry 78. In some applications, the memory array 52 may be configured as ferroelectric random access memory (FeRAM).

Figure 21:
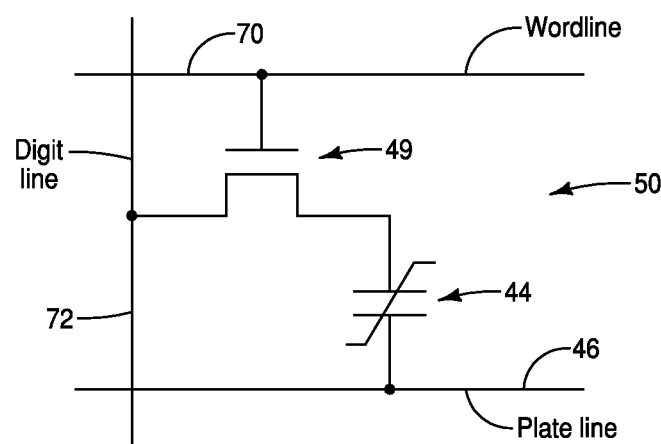
FIG. 21 is a schematic diagram of an example memory cell comprising a ferroelectric capacitor.

The memory cells 50 may include the transistors 49 (described above with reference to FIG. 12) in combination with the ferroelectric capacitors. For instance, in some applications each of the memory cells 50 may include one of the transistors 49 in combination with a ferroelectric capacitor 44, as shown in FIG. 21. The memory cell 50 is shown coupled with a wordline 70 and a digit line 72. Also, one of the electrodes of the capacitor 44 is shown coupled with a plate line comprising the plate material 46. The plate line may be utilized in combination with the wordline 70 for controlling an operational state of the ferroelectric capacitor 44.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, ALD, CVD, PVD, etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having first electrodes with top surfaces, and with sidewall surfaces extending downwardly from the top surfaces. The first electrodes are solid pillars. Insulative material is along the sidewall surfaces of the first electrodes. Second electrodes extend along the sidewall surfaces of the first electrodes and are spaced from the sidewall surfaces by the insulative material. Conductive-plate-material extends across the first and second electrodes, and couples the second electrodes to one another. Leaker-devices electrically couple the first electrodes to the conductive-plate-material and are configured to discharge at least a portion of excess charge from the first electrodes to the conductive-plate-material.

Some embodiments include an integrated assembly having first electrodes which are horizontally-spaced from one another, and which are configured as vertically-extending pillars. Each of the vertically-extending pillars has sidewall surfaces along a cross-section, has a bottom surface, and has a top surface, with the sidewall surfaces extending from the bottom surface to the top surface. Insulative material is along the sidewall surfaces of the vertically-extending pillars. Second electrodes are laterally between the vertically-extending pillars and are spaced from the sidewall surfaces by the insulative material. Conductive-plate-material extends across the first and second electrodes, and couples the second electrodes to one another. Leaker-devices extend from the top surfaces of the vertically-extending pillars to the conductive-plate-material. The leaker-devices are configured to discharge at least a portion of excess charge from the first electrodes to the conductive-plate-material.

Some embodiments include a method of forming an apparatus. An assembly is provided which includes conductive pillars extending vertically through a supporting structure to conductive contacts. The supporting structure comprises an insulative-lattice-material over a sacrificial material. A planarized upper surface of the assembly extends across top surfaces of the conductive pillars and across a top surface of the insulative-lattice-material. The top surfaces of the conductive pillars are recessed relative to the top surface of the insulative-lattice-material. Leaker-device-material is formed along the recessed top surfaces of the conductive pillars. The sacrificial material is removed to expose sidewall surfaces of the conductive pillars and to leave openings between the conductive pillars. The openings are lined with insulative-capacitor-material to form the insulative-capacitor-material along the sidewall surfaces of the conductive pillars. Capacitor-electrode-material is formed within the lined openings. The capacitor-electrode-material, insulative-capacitor-material and conductive pillars together form a plurality of capacitors. Conductive-plate-material is formed to extend across the capacitor-electrode-material and the leaker-device-material. The conductive-plate-material is electrically coupled with the capacitor-electrode-material and with the leaker-device-material. The leaker-device-material electrically couples the conductive pillars to the conductive-plate-material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   a first electrode having a pillar structure;
   a second electrode spaced from the first electrode by an insulative material;
   a conductive plate coupling the first and second electrodes; and
   a leaker device coupling the first electrode to the conductive plate, the leaker device being configured to discharge excess charge from the first electrodes to the conductive-plate-material.

2. The memory cell of claim 1 wherein the leaker device extends from the top surfaces of the first electrode to the conductive plate.

3. The memory cell of claim 1 further comprising an access transistor coupled to the pillar structure through a conductive contact.

4. The memory cell of claim 1 wherein the leaker device comprises a structure extending between an upper surface of the pillar structure and the conductive plate.

5. The memory cell of claim 1 wherein the leaker device comprises one or more of Ti, Ni and Nb, in combination with one or more of Ge, Si, O, N and C.

6. The memory cell of claim 1 wherein the leaker device comprises one or more of Si, Ge, SiN, TiSiN, TiO, TiN, NiO, NiON and TiON; where the chemical formulas indicate primary constituents rather than particular stoichiometries.

7. The memory cell of claim 1 wherein the insulative material is ferroelectric insulative material.

8. A memory structure, comprising:
   first and second memory cells, each of the first and second memory cells comprising a transistor and a capacitor; the capacitor comprising:
   a first electrode;
   a second electrode adjacent the first electrode and spaced from the first electrode by an insulative material;
   a conductive plate extending across the first electrode and the second electrode; and
   a resistive interconnect extending from a surface of the first electrode to the conductive plate; the resistive interconnect being configured to discharge at least a portion of excess charge from the first electrode to the conductive plate.

9. The memory structure of claim 8 wherein the second memory cell is disposed vertically above the first memory cell.

10. The memory structure of claim 8 wherein the conductive plate extends across multiple memory cells.

11. The memory structure of claim 8 wherein the resistive interconnect comprises an elongated structure extending along the surface of the first electrode.

12. The memory structure of claim 11 wherein the first electrode comprises a vertical pillar and wherein the surface of the first electrode is an upper surface of the vertical pillar.

13. The memory structure of claim 8 wherein the resistive interconnect comprises a structure extending between the surface of the first electrode and the conductive plate material.

14. The memory structure of claim 8 wherein a bottom surface of the first electrode is along a conductive contact coupled with the transistor.

15. The memory structure of claim 8 wherein the resistive interconnect comprises one or more of Ti, Ni and Nb, in combination with one or more of Ge, Si, O, N and C.

16. The memory structure of claim 8 wherein the resistive interconnect comprises one or more of Si, Ge, SiN, TiSiN, TiO, TiN, NiO, NiON and TiON; where the chemical formulas indicate primary constituents rather than particular stoichiometries.

17. The memory structure of claim 8 wherein the first electrode is supported by silicon nitride structures extending between sidewall surfaces of neighboring first electrodes.

18. The memory structure of claim 17 wherein the silicon nitride structures and the resistive interconnect have coplanar upper surfaces relative to each other.

19. A method of forming a memory structure, comprising:
   forming a first electrode;
   forming a second electrode adjacent the first electrode and spaced from the first electrode by an insulative material;
   forming a conductive plate extending across the first electrode and the second electrode; and
   forming a resistive interconnect extending from a surface of the first electrode to the conductive plate; the resistive interconnect comprising one or more of Ti, Ni and Nb, in combination with one or more of Ge, Si, O, N and C and being configured to discharge at least a portion of excess charge from the first electrode to the conductive plate.

20. The method of claim 19 wherein the first electrode is configured as a conductive pillar.

* * * * *